(12) United States Patent
Kim et al.

(10) Patent No.: US 11,787,190 B2
(45) Date of Patent: Oct. 17, 2023

(54) INKJET PRINTING DEVICE, INK EJECTING METHOD, AND METHOD FOR MANUFACTURING DISPLAY DEVICE

(71) Applicant: Samsung Display Co., LTD., Yongin-si (KR)

(72) Inventors: Han Su Kim, Seoul (KR); Eun A Yang, Yongin-si (KR); Jong Hyuk Kang, Suwon-si (KR); Hyun Min Cho, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 95 days.

(21) Appl. No.: 17/418,048

(22) PCT Filed: Nov. 6, 2019

(86) PCT No.: PCT/KR2019/014942
§ 371 (c)(1),
(2) Date: Jun. 24, 2021

(87) PCT Pub. No.: WO2020/138702
PCT Pub. Date: Jul. 2, 2020

(65) Prior Publication Data
US 2022/0072864 A1 Mar. 10, 2022

(30) Foreign Application Priority Data
Dec. 24, 2018 (KR) .................. 10-2018-0168382

(51) Int. Cl.
*B41J 2/175* (2006.01)
*B41J 2/125* (2006.01)
(Continued)

(52) U.S. Cl.
CPC .......... *B41J 2/17503* (2013.01); *B41J 2/125* (2013.01); *B41J 2/17566* (2013.01); *B41J 2/195* (2013.01); *G02F 1/1303* (2013.01); *H10K 71/135* (2023.02)

(58) Field of Classification Search
CPC .... B41J 2/17503; B41J 2/125; B41J 2/17566; B41J 2/195; H01L 51/0005
See application file for complete search history.

(56) References Cited

U.S. PATENT DOCUMENTS 10,000,065 B1  6/2018 Baker et al.
10,259,234 B2  4/2019 Baker et al.
(Continued)

FOREIGN PATENT DOCUMENTS

CN   1820957     8/2006
CN   1020660115  5/2011
(Continued)

OTHER PUBLICATIONS

International Search Report, with English translation, corresponding to International Application No. PCT/KR2019/014942 dated Feb. 14, 2020.
(Continued)

*Primary Examiner* — Sharon Polk
(74) *Attorney, Agent, or Firm* — KILE PARK REED & HOUTTEMAN PLLC

(57) ABSTRACT

An inkjet printing device includes an ink reservoir that stores ink containing particles, an inkjet head part that receives the ink from the ink reservoir and ejects the ink onto a target substrate and a driver for rotating the ink reservoir.

16 Claims, 26 Drawing Sheets

(51) Int. Cl.
  *B41J 2/195* (2006.01)
  *G02F 1/13* (2006.01)
  *H10K 71/13* (2023.01)

(56) References Cited

U.S. PATENT DOCUMENTS

| | | |
|---|---|---|
| 2001/0017642 A1 | 8/2001 | Shigemura |
| 2006/0185587 A1 | 8/2006 | Shang et al. |
| 2011/0115844 A1 | 5/2011 | Ozawa |
| 2017/0144444 A1 | 5/2017 | Williams et al. |
| 2017/0326583 A1 | 11/2017 | Ito et al. |
| 2021/0101396 A1 | 4/2021 | Carson et al. |
| 2022/0080739 A1 | 3/2022 | Hernandez Creus et al. |

FOREIGN PATENT DOCUMENTS

| | | | |
|---|---|---|---|
| EP | 3 415 240 | 12/2018 | |
| JP | 10-340058 | 12/1998 | |
| JP | 2001-322297 | 11/2001 | |
| JP | 3743121 | 2/2006 | |
| JP | 2013-208760 | 10/2013 | |
| JP | 2013-237219 | 11/2013 | |
| JP | 6421189 | 11/2018 | |
| KR | 10-2006-0093077 | 8/2006 | |
| KR | 10-2018-0007376 | 1/2018 | |
| KR | 10-2020-0034905 | 4/2020 | |
| KR | 10-2020-0130606 | 11/2020 | |
| WO | 2018/186878 | 10/2018 | |
| WO | WO-2019117845 A1 * | 6/2019 | ......... B41J 2/17503 |
| WO | 2020/222740 | 11/2020 | |

OTHER PUBLICATIONS

Written Opinion, with English translation, corresponding to International Application No. PCT/KR2019/014942, dated Feb. 14, 2020.

Chinese Office Action for Chinese Application No. 201980086149.7, dated Jul. 22, 2022.

Extended European Search Report for European Patent Application or Patent No. 19901668.4 dated Jul. 19, 2022.

* cited by examiner

VA: VA1, VA2, VA3
IE: IE1, IE2, IE3, IE4, IE5, IE6
LT: LT1, LT2, LT3, LT4, LT5, LT6, LT7, LT8, LT9

VA: VA1, VA2, VA3
IE_1: IE1_1, IE2_1, IE3_1, IE4_1, IE5_1, IE6_1
LT: LT1, LT2, LT3, LT4, LT5, LT6, LT7, LT8, LT9
600_1: 610_1, 620_1, 630_1, 640_1, 670, 680, 690_1

$t = t1$

VA: VA1, VA2, VA3
IE_2: IE1_2, IE2_2, IE3_2, IE4_2, IE5_2, IE6_2
LT_2: LT1_2, LT3_2, LT5_2
600_2: 610_2, 620_2, 630_2, 640_2, 670, 680, 690_2

INKJET PRINTING DEVICE, INK EJECTING METHOD, AND METHOD FOR MANUFACTURING DISPLAY DEVICE

CROSS-REFERENCE TO RELATED APPLICATION(S)

This application is a national entry of International Application No. PCT/KR2019/014942, filed on Nov. 6, 2019, which claims under 35 U.S.C. § 119(a) and 365(b) priority to and benefits of Korean Patent Application No. 10-2018-0168382, filed on Dec. 24, 2018 in the Korean Intellectual Property Office, the entire contents of which are incorporated herein by reference.

BACKGROUND

(a) Technical Field

The description relates to an inkjet printing device, an ink ejecting method, and a method for manufacturing a display device that are capable of printing a substance to be printed, in which precipitation may occur, with uniform quality even when the process is repeated multiple times.

(b) Description of the Related Art

With the development of multimedia, the importance of display devices has increased. A variety of display devices, such as organic light emitting diode (OLED) display devices and liquid crystal display (LCD) devices are in use.

Display devices include display panels, such as OLED display panels or LCD panels to display images. A display device may include light emitting display panels which include light emitting elements. Examples of light emitting diodes (LEDs) include OLEDs that use organic materials as the fluorescent substance and inorganic LEDs that use inorganic materials as the fluorescent substance.

Inorganic LEDs using inorganic semiconductors as the fluorescent substance have advantages in durability even in a high-temperature environment, and the efficiency of blue light is higher than the OLED. Although difficulty of the manufacturing process that has been a limitation of inorganic LED elements, transfer methods using dielectrophoresis (DEP) techniques have been developed. Thus, research has continued on inorganic LEDs that have superior durability and efficiency compared to OLEDs.

An inkjet printing device may be used to transfer inorganic LED elements using the DEP technique or to form an organic layer included in a display device. The transfer of the inorganic LED element or the formation of the organic layer may also be performed by inkjet printing an ink or solution and following with a post-treatment process. In the inkjet printing device, an ink or solution may be supplied to an inkjet head, and the inkjet head may eject the ink or solution onto a substrate.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Aspects of the embodiments provide an inkjet printing device that may prevent a decrease in the dispersion of particles in an ejected ink due to precipitation of the particles that may occur during the process time.

Aspects of the embodiments also provide a particle ejecting method and a method of manufacturing a display device that may maintain the quality of ejected ink even in cases that the manufacturing process is repeated multiple times.

According to embodiment of the disclosure, an inkjet printing device may comprise an ink reservoir that stores an ink that contains particles, an inkjet head part that receives the ink from the ink reservoir and ejects the ink onto a target substrate, and a driver that rotates the ink reservoir.

In an embodiment, the driver may rotate the ink reservoir with respect to a rotation axis, and the rotation axis may be a driving shaft of the driver on a reference plane that is perpendicular to or tilted with respect to a direction of gravity acting on the ink of the ink reservoir.

In an embodiment, the ink reservoir may include a first surface and a second surface opposite to the first surface. The reference plane may be disposed at an equal distance from the first surface and the second surface.

The ink reservoir may include a first outlet disposed in the first surface of the ink reservoir and a second outlet disposed in the second surface.

The inkjet printing device may further comprise a first pipe and a second pipe. The first outlet may be connected to the inkjet head part through the first pipe, and the second outlet may be connected to the inkjet head part through the second pipe.

At least one of the first outlet and the second outlet may block a movement of the ink toward the inkjet head part.

The inkjet printing device may further comprise a valve connected to the first pipe and the second pipe, and a third pipe connected to the valve and the inkjet head part. The valve may block the connection to at least one of the first pipe, the second pipe, and the third pipe.

The inkjet printing device may further comprise a sensor that measures a degree of dispersion of the particles in the ink stored in the ink reservoir.

In an embodiment, a sensing area may be defined in the direction of gravity acting on the ink in the ink reservoir. The sensor may measure the degree of dispersion of the particles in the sensing area.

The inkjet head part may include a head base part and an inkjet head that includes nozzles that eject the ink containing the particles.

According to embodiment of the disclosure, a particle ejecting method may comprise preparing an ink having particles in an ink reservoir, measuring a first degree of dispersion of the particles in the ink reservoir, ejecting the ink onto a target substrate, and measuring a second degree of dispersion of the particles precipitated in the ink reservoir, and rotating the ink reservoir in case that a ratio of the first degree of dispersion and the second degree of dispersion exceeds a reference value.

The ink reservoir may be rotated with respect to a rotation axis which is a driving shaft on a reference plane that is perpendicular to or tilted with respect to a direction of gravity acting on the ink of the ink reservoir.

The ink reservoir may include a first outlet disposed in a first surface of the ink reservoir and a second outlet disposed in a second surface of the ink reservoir, the second surface being opposite to the first surface.

The ink may be ejected through the first outlet when the particles have the first degree of dispersion and may be ejected through the second outlet after the ink reservoir is rotated.

The particles may include a light emitting element having a dipole.

The method may further comprise forming an electric field on the target substrate after the ink is ejected onto the target substrate, and aligning the particles on the target substrate in a direction in which the particles are oriented by the electric field.

According to embodiment, a method for manufacturing a display device may comprise preparing a target substrate including a first electrode and a second electrode, preparing an ink containing light emitting elements in an ink reservoir, ejecting the ink onto the target substrate and measuring a degree of dispersion of the light emitting elements precipitated in the ink reservoir, and rotating the ink reservoir in case that the degree of dispersion exceeds a reference value.

The ink reservoir may be rotated with respect to a rotation axis which is a driving shaft on a reference plane that is perpendicular to or tilted with respect to a direction of gravity acting on the ink, and the light emitting elements precipitated in the ink reservoir may be dispersed in the ink.

The method may further comprise stopping the ejecting of the ink in case that the degree of dispersion exceeds the reference value.

The method may further comprise forming an electric field on the target substrate after the ink is ejected, and aligning the light emitting elements on the target substrate in a direction in which the light emitting elements are oriented by the electric field so that the light emitting elements land between the first electrode and the second electrode.

An inkjet printing device according to an embodiment may maintain a degree of dispersion of particles in an ink reservoir even in case that the process is repeated multiple times. Also, in case that ejecting an ink onto a target substrate using the inkjet printing device, an ink having uniform quality can be ejected to improve the reliability of a manufactured display device.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
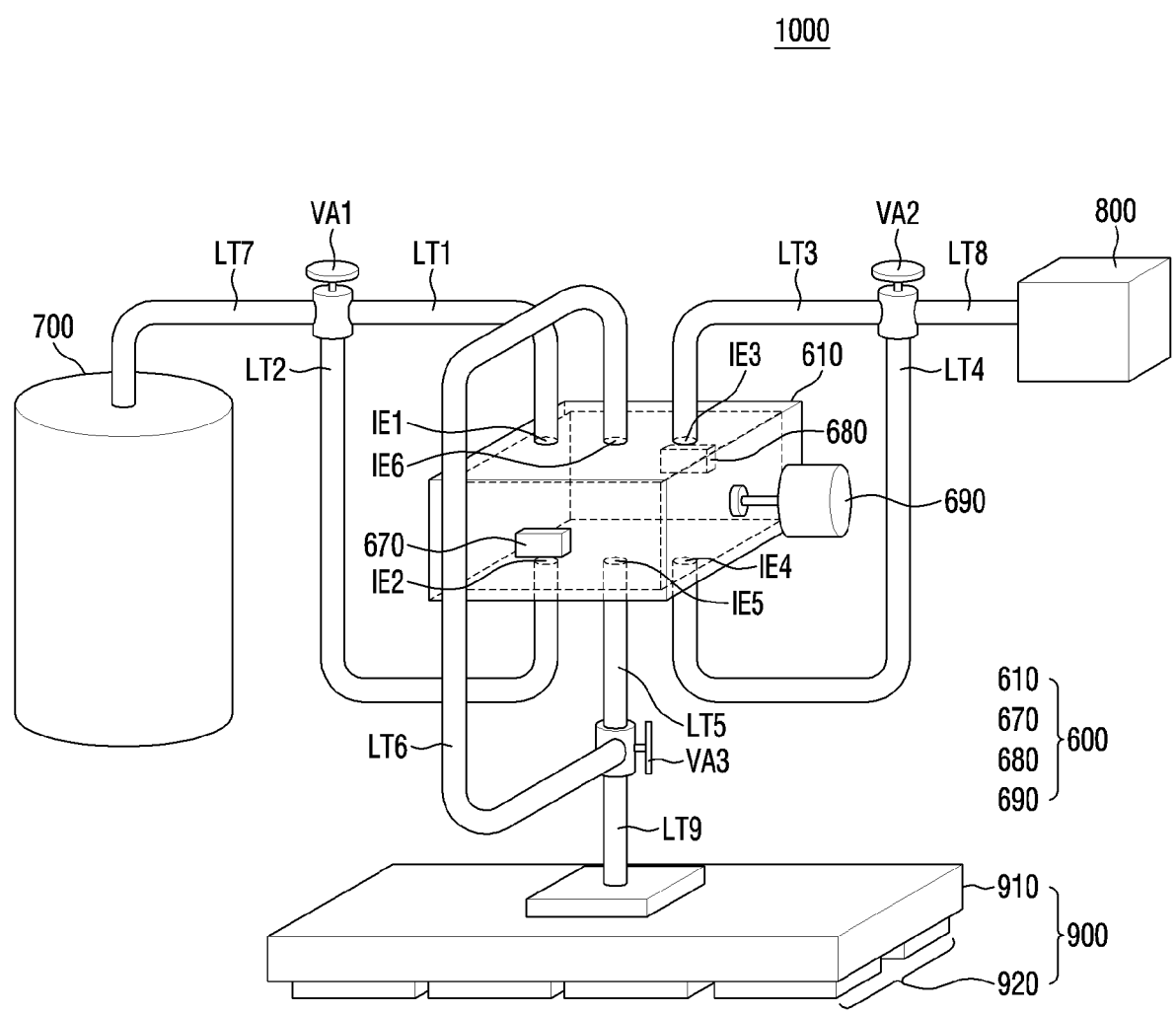
FIG. 1 is a schematic perspective view of an inkjet printing device according to an embodiment.

The disclosure will now be described more fully hereinafter with reference to the accompanying drawings, in which embodiments of the disclosure are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

In the specification and the claims, the phrase "at least one of" is intended to include the meaning of "at least one selected from the group of" for the purpose of its meaning and interpretation. For example, "at least one of A and B" may be understood to mean "A, B, or A and B."

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

It will be understood that, although the terms first, second, etc., may be used herein to describe various elements, these elements should not be limited by these terms. These terms are only used to distinguish one element from another element. For example, a first element may be referred to as a second element, and similarly, a second element may be referred to as a first element without departing from the scope of the disclosure.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

It will be understood that when an element (or a region, a layer, a portion, or the like) is referred to as "being on", "connected to" or "coupled to" another element in the specification, it can be directly disposed on, connected, or coupled to another element mentioned above, or intervening elements may be disposed therebetween.

Hereinafter, embodiments will be described with reference to the accompanying drawings.

Figure 2:
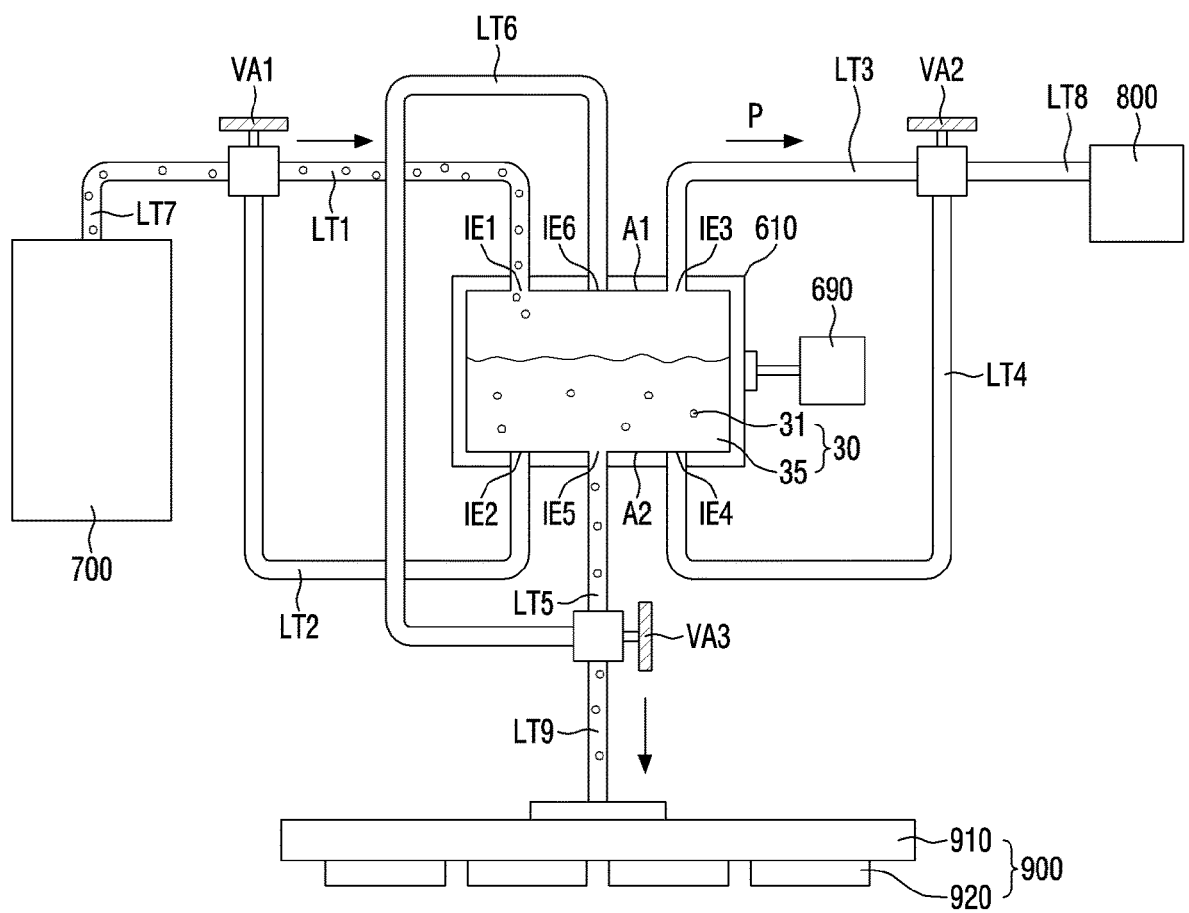
FIG. 2 is a schematic cross-sectional view illustrating the inkjet printing device of FIG. 1.

FIG. 1 is a schematic perspective view of an inkjet printing device according to an embodiment. FIG. 2 is a schematic cross-sectional view illustrating the inkjet printing device of FIG. 1.

In the drawings, a first direction D1, a second direction D2, and a third direction D3 are defined. The first direction D1 and the second direction D2 are directions that are coplanar and orthogonal to each other, and the third direction D3 is a direction that is perpendicular to each of the first direction D1 and the second direction D2.

FIGS. 1 and 2 are drawings for describing a configuration of an inkjet printing device 1000 according to an embodiment, but the structure and arrangement of the inkjet printing device 1000 according to the embodiments are not limited to those illustrated in FIGS. 1 and 2. The inkjet printing device 1000 may include more components or have a structure different from those illustrated in FIGS. 1 and 2.

Referring to FIGS. 1 and 2, the inkjet printing device 1000 according to an embodiment may include an ink reservoir 600, an ink tank 700, a pressure controller 800, and an inkjet head part 900. The inkjet printing device 1000 may include a of pipes LT, and each of the ink tank 700, the pressure controller 800, and the inkjet head part 900 may be connected to the ink reservoir 600 through at least one pipe LT. An ink 30 supplied from the ink tank 700 to the ink reservoir 600 may be ejected or discharged onto a target substrate through the inkjet head part 900.

The ink tank 700 may store manufactured ink 30 and supply the ink 30 to the ink reservoir 600. The shape of the ink tank 700 is not limited, and the ink tank 700 having a cylindrical shape is illustrated in the drawings. For example, the ink tank 700 may be an ink cartridge, an ink vessel, or the like. Although not illustrated in the drawings, the ink tank 700 may further include a pneumatic pressure forming device that transmits a pressure for supplying the ink 30 to the ink reservoir 600.

In an embodiment, the ink 30 may contain a solvent 35 and particles 31 contained in the solvent 35. In an embodiment, the ink 30 may be provided in the form of a solution or a colloidal state. For example, the solvent 35 may be acetone, water, alcohol, toluene, propylene glycol (PG), propylene glycol methyl acetate (PGMA), or the like, but is not limited thereto. The particles 31 may be contained in a dispersed state in the solvent 35 and supplied to the ink reservoir 600 and may eventually be ejected or discharged from the inkjet printing device 1000 through the inkjet head part 900.

In some cases, the particles 31 may maintain the initial dispersed state for an amount of time and precipitate or settle in the solvent 35. FIG. 2 illustrates a state of the inkjet printing device 1000 at an initial point in time (a first point in time, t=t1), and after an amount of time elapses, a degree of dispersion per unit volume of the particles 31 in the ink 30 may change due to precipitation. The inkjet printing device 1000 according to an embodiment may disperse the precipitated or settled particles 31 again by rotating the ink reservoir 600. This will be described in detail below.

The pressure controller 800 may transmit a pressure P to the ink 30 supplied to the ink reservoir 600. The ink 30 may receive the pressure P from the pressure controller 800 and may be ejected or discharged with a pressure through the inkjet head part 900 without flowing. The shape and type of the pressure controller 800 are not limited. For example, the pressure controller 800 may be a Meniscus pressure controller, and the pressure P transmitted from the pressure controller 800 to the ink reservoir 600 may be a negative pressure.

The ink reservoir 600 may serve to receive the ink 30 from the ink tank 700 and deliver the ink 30 to the inkjet head part 900. The inkjet printing device 1000 may deliver the ink 30 to the inkjet head part 900 through the ink reservoir 600 instead of directly supplying the ink 30 from the ink tank 700 to the inkjet head part 900. Accordingly, as will be described below, the inkjet printing device 1000 may control the quality of the ink 30 supplied through the ink reservoir 600.

The ink reservoir 600 may include a housing 610 that stores or accommodates the ink 30, and the housing 610 may include multiple outlets IE that are formed in a surface and connected to the one or more pipes LT, sensors 670 and 680, and a driver 690.

The housing 610 may temporarily store or accommodate the ink 30 supplied from the ink tank 700. The shape of the housing 610 is not limited, and the housing 610 having a hexahedral shape, of which each edge extends in a direction, is illustrated as an example in the drawings. In other embodiments, the housing 610 may have other shapes, e.g., a cylindrical shape, a spherical shape, or the like, to store or accommodate the ink 30. Also, the housing 610 may be made of a material whose shape does not change due to the pressure transmitted from the pressure controller 800 which will be described below, but the embodiments are not limited by material of the housing 610.

The outlets IE may be formed in at least one surface of the housing 610 and connected to at least one pipe LT. The outlet IE may supply or deliver the ink 30 through the pipe LT connected thereto and may also transmit the pressure P into the housing 610. The outlets IE include first to sixth outlets IE1, IE2, IE3, IE4, IE5, and IE6, and a case in which three outlets IE are formed in each of both surfaces of the housing 610 in the third direction D3, for example, an upper surface and a lower surface of the housing 610, is illustrated in the drawings. The first outlet IE1, the third outlet IE3, and the sixth outlet IE6 may be disposed in the upper surface, which is a first surface A1 of the ink reservoir 600, and the second outlet IE2, the fourth outlet IE4, and the fifth outlet IE5 may be disposed in the lower surface, which is a second surface A2 of the ink reservoir 600. However, the embodiments are not limited by the number and arrangement of outlets IE. The number of outlets IE may be more or less, and in some cases, at least some of the outlets IE may be formed in a side surface of the housing 610 in the first direction D1 or the second direction D2. The ink 30 may be supplied from the side surface of the housing 610 and delivered to the inkjet head part 900. However, the position at which the outlets IE are formed may be the upper surface or lower surface of the housing 610, and the outlet IE connected to the pressure controller 800 may be formed in the upper surface of the housing 610 so that the outlet IE does not contact the ink 30 when the pressure P is transmitted. Also, although not illustrated in the drawings, a blocking component that blocks delivery of the ink 30 or transmission of the pressure P may be disposed at the outlet IE. In case that the ink reservoir 600 rotates in an operation which will be described below, the blocking component of the outlet IE may block the delivery of the ink 30 or the transmission of the pressure P.

The sensors 670 and 680 may be disposed on any side surfaces of the housing 610 in the first direction D1 or the second direction D2. The sensors 670 and 680 may include a first sensor 670 and a second sensor 680, and the first sensor 670 and the second sensor 680 may be disposed on opposing side surfaces of the housing 610. However, the embodiments are not limited thereto. The sensors 670 and 680 may also be included in the inkjet printing device 1000 as a separate device without being disposed on the housing 610.

The sensors 670 and 680 may sense a concentration of the ink 30 supplied into the ink reservoir 600, the degree of dispersion of the particles 31, and the like. For example, the first sensor 670 may generate a signal and provide the signal to the second sensor 680 via the ink 30 provided to the housing 610. The second sensor 680 may receive the signal and measure the concentration of the ink 30 provided to the housing 610, the degree of dispersion of the particles 31, and the like. For example, each of the sensors 670 and 680 may be an optical sensor, a laser sensor, and the like, and the first sensor 670 may be a component that generates light or laser, and the second sensor 680 may be a component that receives the light or laser.

The driver 690 may rotate with one direction as an axis of rotation. The driver 690 may be disposed on at least one surface of the housing 610, e.g., one side surface of the housing 610 in the first direction D1 or the second direction D2. The driver 690 may be disposed on one side surface on which the sensors 670 and 680 are not disposed, but the embodiments are not limited thereto. The driver 690 may rotate in one direction or both directions, and accordingly, the housing 610 connected to the driver 690 may also rotate. The embodiments are not limited by the shape of the driver 690, and as illustrated in the drawings, the driver 690 may have a cylindrical shape, which has a circular cross-section, and rotate. The driver 690 may include an operating part connected to another component to perform rotation and a transmitting component connected to the operating part and the housing 610 to transmit a rotational force due to the rotation, but the embodiments are not limited thereto. For example, the driver 690 may be a rotary motor, and in some cases, the driver 690 may also be disposed in the inkjet printing device 1000 as a separate device without being disposed on the housing 610.

The inkjet head part 900 may eject or discharge the ink 30 delivered from the ink reservoir 600 onto a target substrate (not illustrated). Although not illustrated in the drawings, the inkjet head part 900 may be disposed on a frame and eject or discharge the ink 30 onto a target substrate prepared below the frame.

The inkjet head part 900 may include a base part 910 and one or more inkjet heads 920 that are disposed on a lower surface of the base part 910 and include multiple nozzles 925. The base part 910 may have a shape extending in one direction. For example, a direction in which the base part 910 extends may be the same as a direction in which the frame extends. As illustrated in the drawings, the base part 910 may include a long side extending in the first direction D1 and a short side extending in the second direction D2. However, the shape of the base part 910 is not limited thereto.

Although not illustrated in the drawings, the base part 910 of the inkjet head part 900 may be disposed on a frame extending in the first direction D1. In some embodiments, the base part 910 may be disposed on a moving component disposed on the frame and move in one direction, e.g., the second direction D2 in which the short side of the base part 910 extends. Accordingly, in case that the target substrate has an area larger than a cross-sectional area of the base part 910, the inkjet head part 900 may move in one direction and eject or discharge the ink 30.

A partially protruding area may be formed on an upper surface of the base part 910, and the base part 910 may be connected to the pipe LT through the protruding area. The base part 910 may include a first internal tube 911 (refer to FIG. 3) formed therein and connected to the pipe LT, and the ink 30 delivered from the ink reservoir 600 may move to the first internal tube 911 through the pipe LT.

The inkjet heads 920 may be disposed on a lower surface of the base part 910 and arranged in a direction in which the base part 910 extends. The inkjet heads 920 may be arranged in a single row or multiple rows, and a case in which the inkjet heads 920 arranged in the first direction D1 are arranged in two rows is illustrated in the drawings. However, the embodiments are not limited thereto, and the inkjet head part 900 may include more inkjet heads 920. In an embodiment, the number of inkjet heads 920 included in a single inkjet head part 900 may be in a range of 128 to 1800, but the embodiments are not limited thereto.

The inkjet head 920 may include one or more nozzles 925, and the ink 30 delivered from the base part 910 may be ejected through the nozzles 925. The inkjet head 920 may include a second internal tube 921 disposed therein, and the second internal tube 921 may be connected to the first internal tube 911 of the base part 910 and the nozzles 925. The ink 30 may flow along the first internal tube 911 and the second internal tube 921 and then be ejected through each nozzle 925. In case that the ink 30 is ejected through the nozzle 925 in the inkjet head 920, the negative pressure transmitted from the pressure controller 800 may be transmitted to the nozzle 925 and the ink 30 may not flow. The amount of the ink 30 ejected through the nozzle 925 may be controlled according to a voltage applied to each inkjet head 920. In an embodiment, the amount of the ink 30 discharged at one time through a single nozzle 925 of the inkjet head 920 may be in a range of 1 to 50 pl (picoliters), but the embodiments are not limited thereto.

Figure 3:
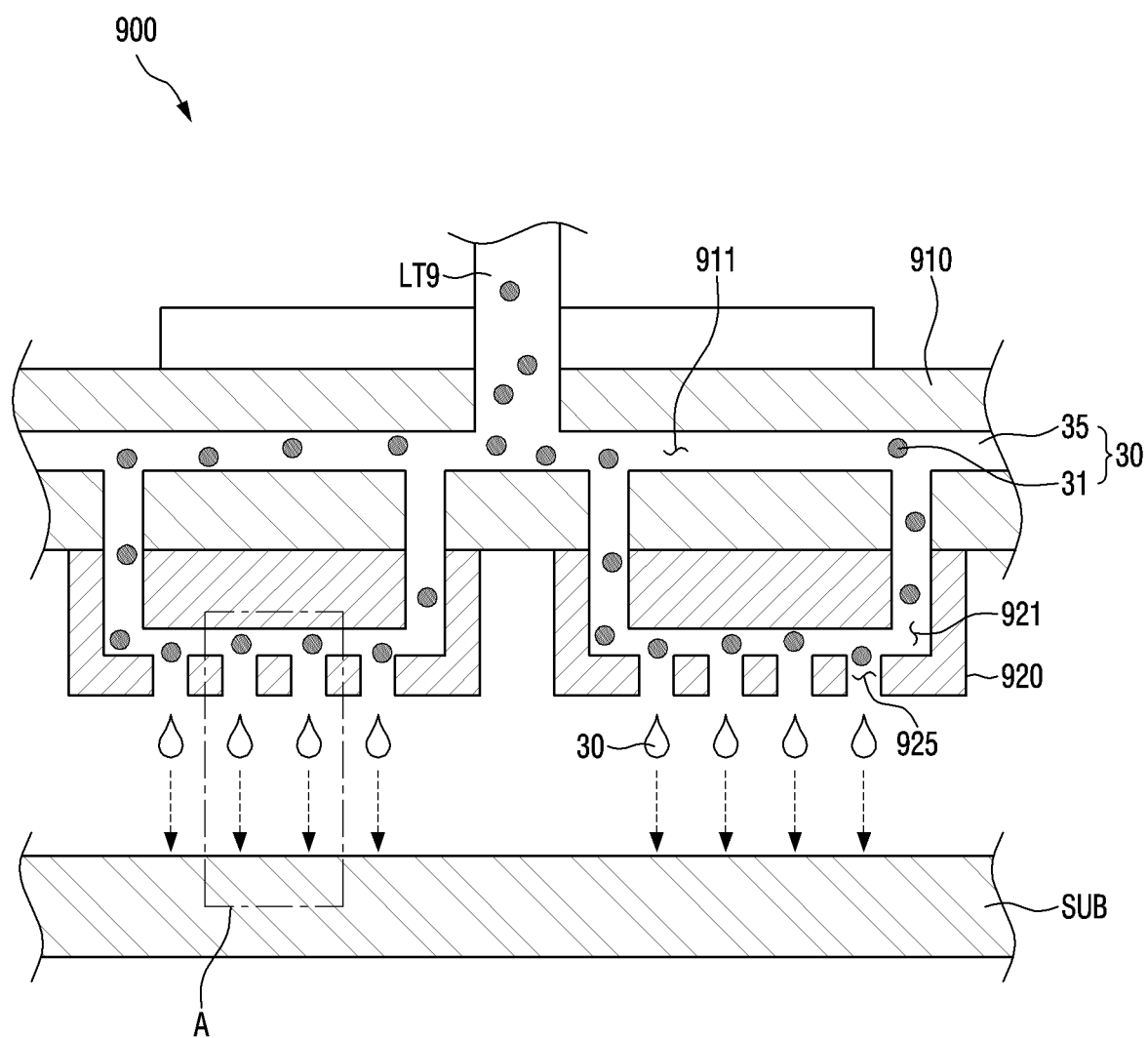
FIG. 3 is a schematic partial cross-sectional view of an inkjet head part according to an embodiment.
Figure 4:
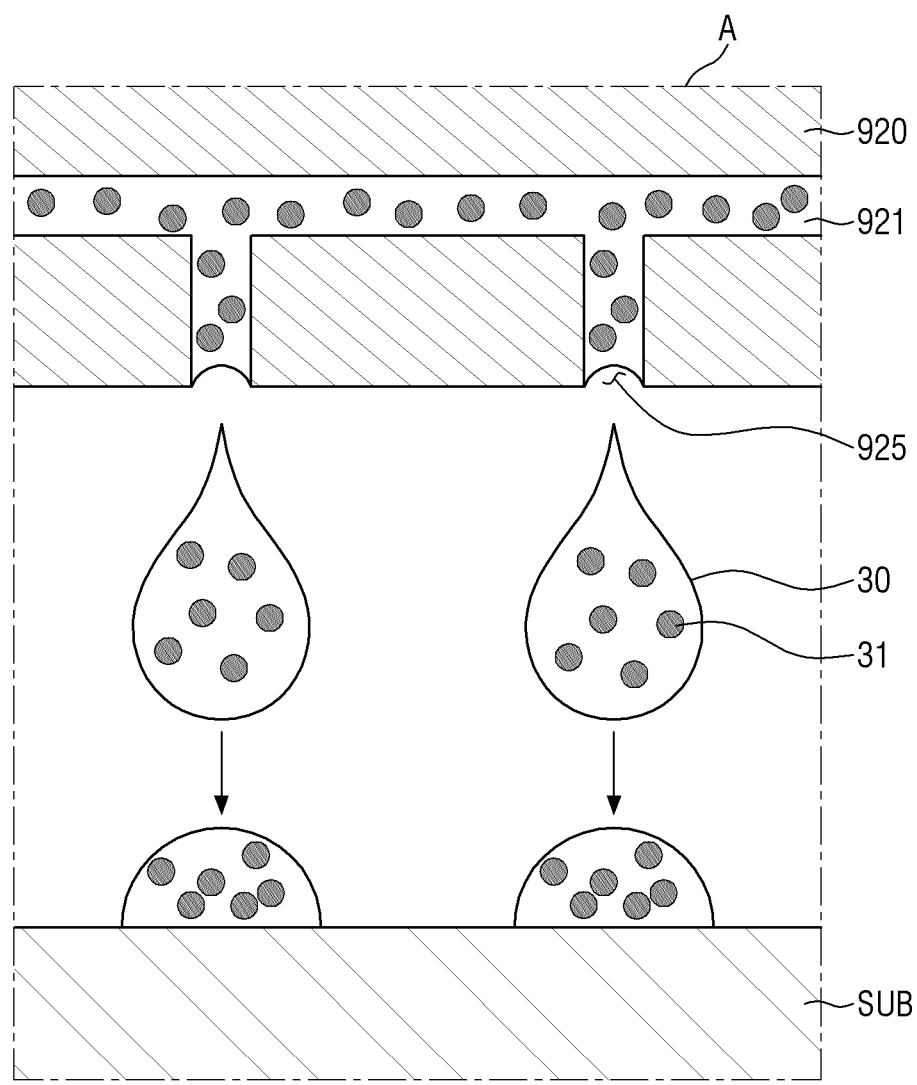
FIG. 4 is an enlarged view of portion A of FIG. 3.

FIG. 3 is a partial schematic cross-sectional view of an inkjet head part according to an embodiment. FIG. 4 is an enlarged view of portion A of FIG. 3.

Referring to FIGS. 3 and 4, the ink 30 supplied from the ink reservoir 600 may be ejected or discharged through the first internal tube 911 of the base part 910, the second internal tube 921 of the inkjet head 920, and the nozzle 925. Here, due to the negative pressure transmitted from the pressure controller 800, at an outlet of the nozzle 925, the ink 30 may form an interface that is concave upward in the drawings. In a case in which the negative pressure is not transmitted by the pressure controller 800, at the outlet of the nozzle 925, the ink 30 may form an interface that is convex downward in the drawings.

It may be difficult to control the amount of the ink 30 discharged at one time through the nozzle 925 or the shape of the ink 30 when the ink 30 is ejected. In some cases, the ink 30 may flow in an undesired state, or as an interface of the ink 30 is exposed at the inkjet head 920, the ink 30 may be dried and aggregate around the nozzle 925. In order to prevent this, the inkjet printing device 1000 may include the pressure controller 800, and the ink 30 may form a concave interface at the outlet of the nozzle 925.

The ink 30 discharged through the nozzle 925 may contain the particles 31 dispersed in the solvent 35. In a state in which the particles 31 are dispersed, the ink 30 may be discharged through the nozzle 925 and ejected onto a target substrate SUB. In some embodiments, through a subsequent process, the ink 30 may be dried or the solvent 35 may be volatilized and only the particles 31 may land on the target substrate SUB. Accordingly, the inkjet printing device 1000 according to an embodiment may eject the ink 30 containing the particles 31 onto the target substrate SUB and cause only the particles 31 to land or be printed on the target substrate SUB through a subsequent process.

Referring to FIGS. 1 and 2 again, the inkjet printing device 1000 may include the pipes LT, e.g., first to ninth pipes LT1 to LT9. Among the pipes LT, the first to sixth pipes LT1, LT2, LT3, LT4, LT5, and LT6 may be connected to the ink reservoir 600, and the seventh to ninth pipes LT7 to LT9 may be connected to the ink tank 700, the pressure controller 800, and the inkjet head part 900, respectively. The first to sixth pipes LT1, LT2, LT3, LT4, LT5, and LT6 may be connected to the first to sixth outlets IE1, IE2, IE3, IE4, IE5, and IE6 of the ink reservoir 600, respectively.

The ink tank 700 may be connected to the seventh pipe LT7. In an embodiment, the seventh pipe LT7 may be connected to the first pipe LT1 and the second pipe LT2 through a first valve VA1, and the ink tank 700 may supply the ink 30 to the ink reservoir 600 through the pipe LT connected thereto.

The pressure controller 800 may be connected to the eighth pipe LT8. In an embodiment, the eighth pipe LT8 may be connected to the third pipe LT3 and the fourth pipe LT4 through a second valve VA2, and the pressure controller 800 may transmit a pressure to the ink 30 of the ink reservoir 600 through the pipe LT connected thereto.

The inkjet head part 900 may be connected to the ninth pipe LT9. In an embodiment, the ninth pipe LT9 may be connected to the fifth pipe LT5 and the sixth pipe LT6 through a third valve VA3, and the inkjet head part 900 may receive the ink 30 of the ink reservoir 600 through the pipe LT connected thereto.

The connection of the seventh to ninth pipes LT7, LT8, and LT9 and the other pipes LT1, LT2, LT3, LT4, LT5, and LT6 may be changed according to process operations of the inkjet printing device 1000. As will be described below, connections between the pipes LT may be controlled according to the degree of dispersion of the particles 31 in the ink 30, and the pipes LT and the outlets IE through which the ink 30 moves may be changed.

In an embodiment, the seventh to ninth pipes LT7, LT8, and LT9 may be connected to different pipes LT through valves VA. The inkjet printing device 1000 may control the connection between the pipes LT through the valves VA during process operations. According to an embodiment, the inkjet printing device 1000 may control the valves VA according to operations so that the pipes LT are connected to different pipes LT according to a point in time. The connection relationship between the pipes LT and the valves VA will be described below with reference to other drawings.

As illustrated in FIG. 4, the number of particles 31 contained in the ink 30 when the ink 30 is discharged once through the nozzle 925 may be changed according to the number of particles 31 contained per unit volume of the ink 30 of the ink reservoir 600. For example, as in FIG. 2, in the initial process operation (the first point in time, t=t1) of the inkjet printing device 1000, the particles 31 may be uniformly dispersed in the ink 30 of the ink reservoir 600, the ink 30 discharged at one time through each nozzle 925 may contain the same number of particles 31, and the ink 30 may contain a large number of particles 31 per unit volume.

As described above, the particles 31 may precipitate or settle in the solvent 35, and as the printing process is performed using the inkjet printing device 1000, the number of particles 31 dispersed per unit volume of the ink 30 may vary.

Figure 5:
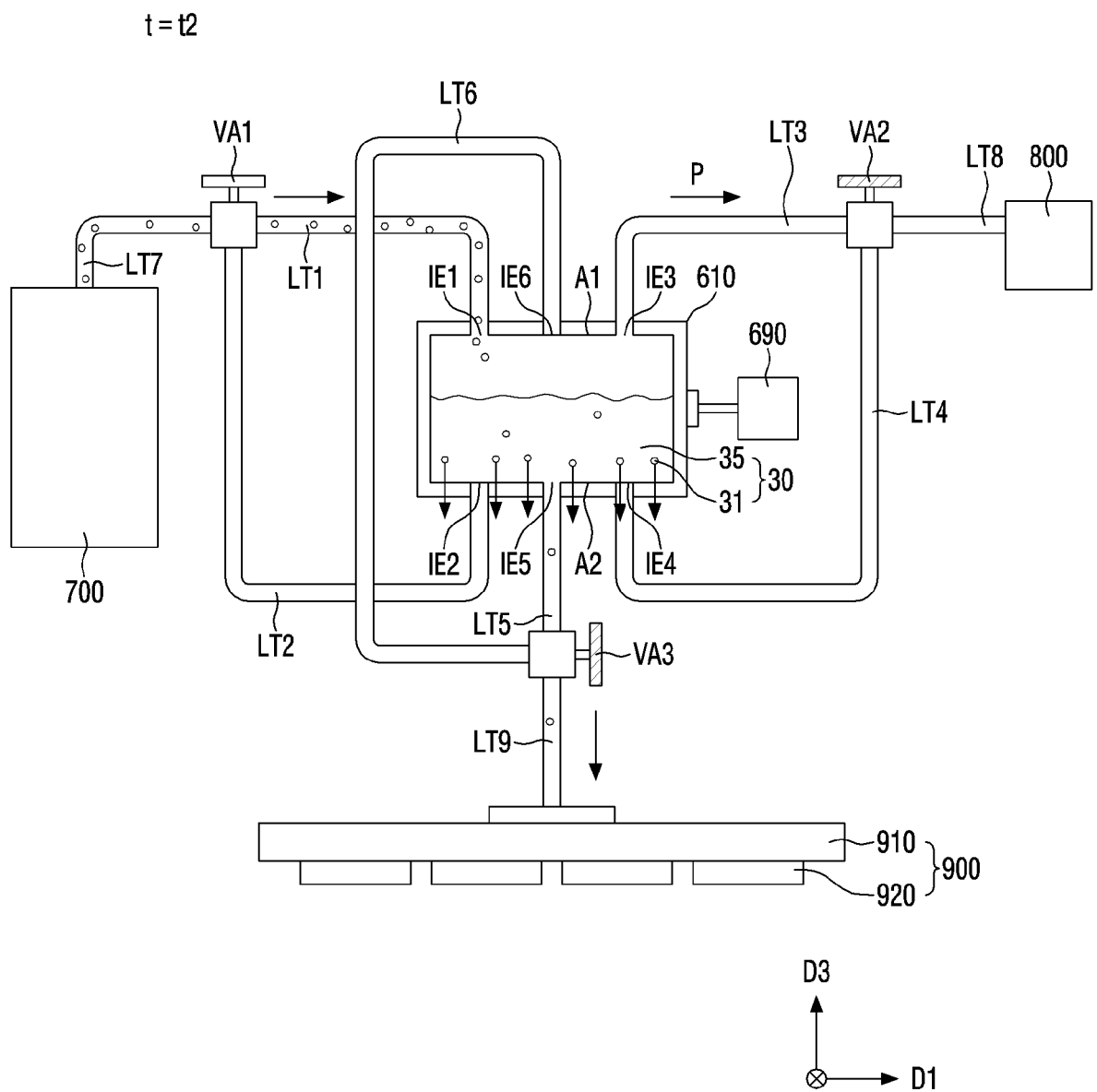
FIG. 5 is a schematic cross-sectional view of the inkjet printing device according to an embodiment at one point in time.
Figure 6:
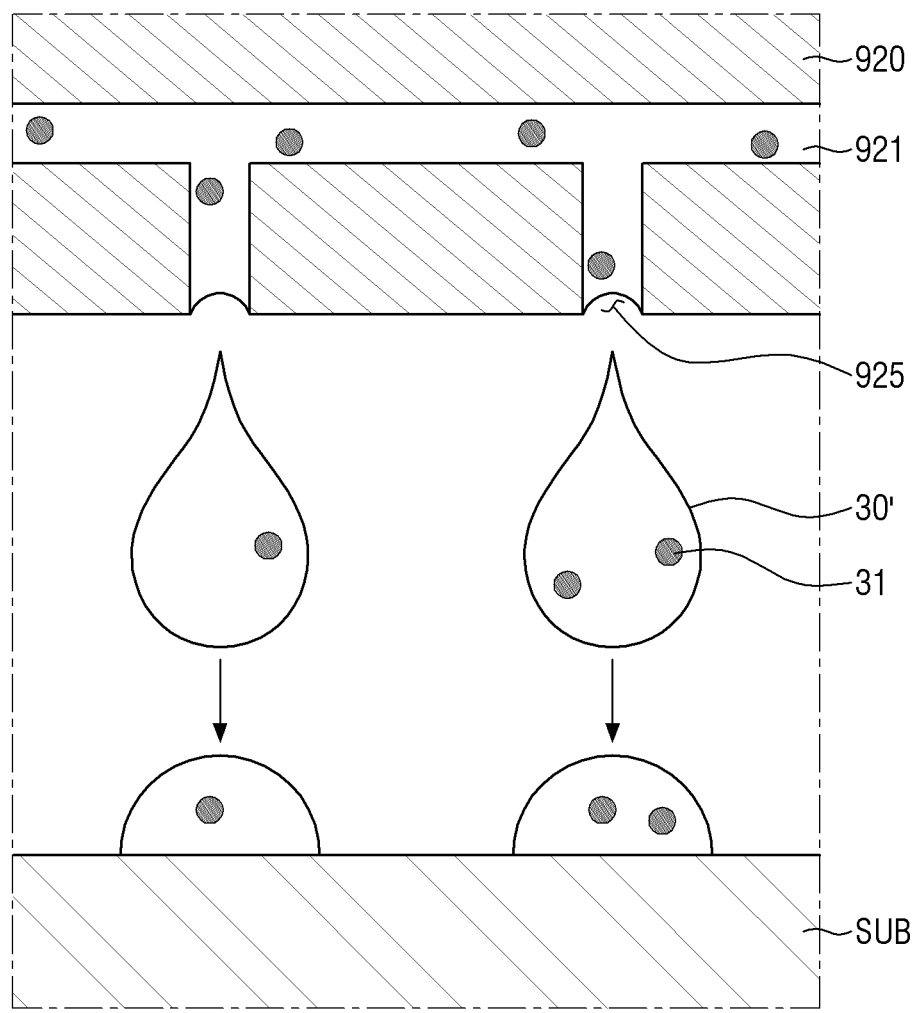
FIG. 6 is an enlarged schematic cross-sectional view illustrating ink discharging in FIG. 5.

FIG. 5 is a schematic cross-sectional view of the inkjet printing device according to an embodiment at a point in time. FIG. 6 is an enlarged schematic cross-sectional view illustrating ink discharging in FIG. 5. FIG. 5 illustrates the ink reservoir 600 of the inkjet printing device 1000 after an amount of time elapses (a second point in time, t=t2).

Referring to FIG. 5, while the printing process is performed using the inkjet printing device 1000, gravity may act on the particles 31 dispersed in the ink 30 in the ink reservoir 600 in a direction opposite to the third direction D3. The particles 31, whose specific gravity is larger than that of the solvent 35, may precipitate or settle on the second surface A2, e.g., the lower surface, of the ink reservoir 600 and have a non-uniform degree of dispersion in the ink 30, and an area in which only the solvent 35 is present may be formed at an upper portion of the ink 30. In case that the particles 31 precipitate on the lower surface of the housing 610 and aggregate with each other, the particles 31 may not move to the pipes LT connected to the ink reservoir 600, and the number of particles 31 delivered to the inkjet head part 900 may decrease.

Referring to FIG. 6, as compared to FIG. 4, in an ink 30' discharged from the inkjet printing device 1000 at the second point in time (t=t2), the degree of dispersion of the particles 31 may not be uniform and the number of particles 31 contained in the ink 30' may be small. Accordingly, the number of particles 31 contained in the ink 30' may vary between ink 30' droplets ejected onto the target substrate SUB, and consequently, the number of particles 31 disposed in different areas of the target substrate SUB, on which the printing process is completed, may not be uniform. In order to prevent this, the inkjet printing device 1000 according to an embodiment may include the sensors 670 and 680 that senses the degree of dispersion of the particles 31 in the ink reservoir 600 and may include the driver 690 that rotates the ink reservoir 600 according to the sensed degree of dispersion of the particles 31.

Figure 7:
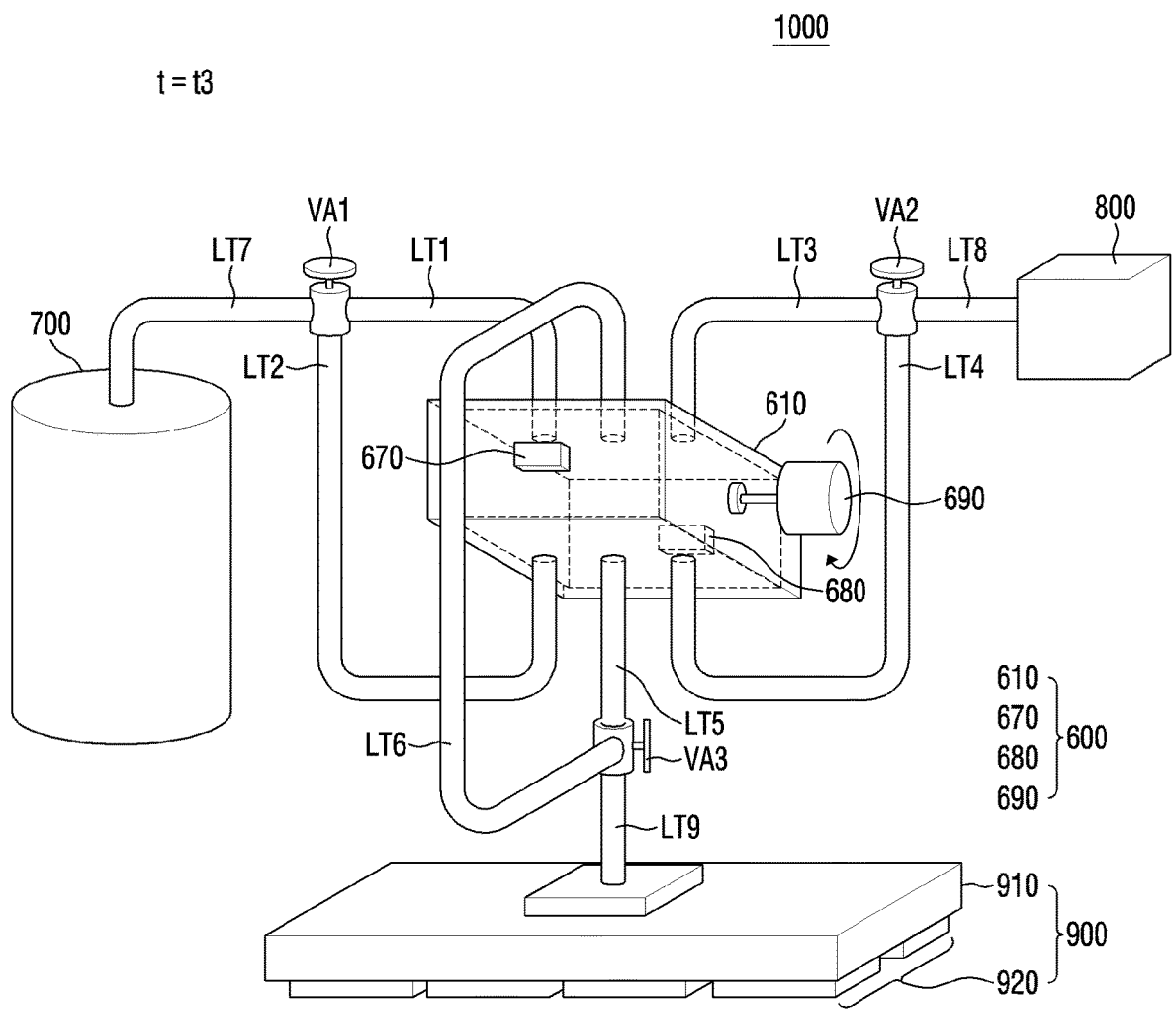
FIGS. 7 and 8 are schematic perspective views according to driving states of the inkjet printing device according to an embodiment.
Figure 7:
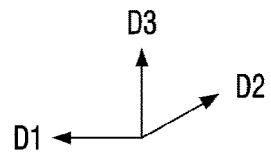
Figure 8:
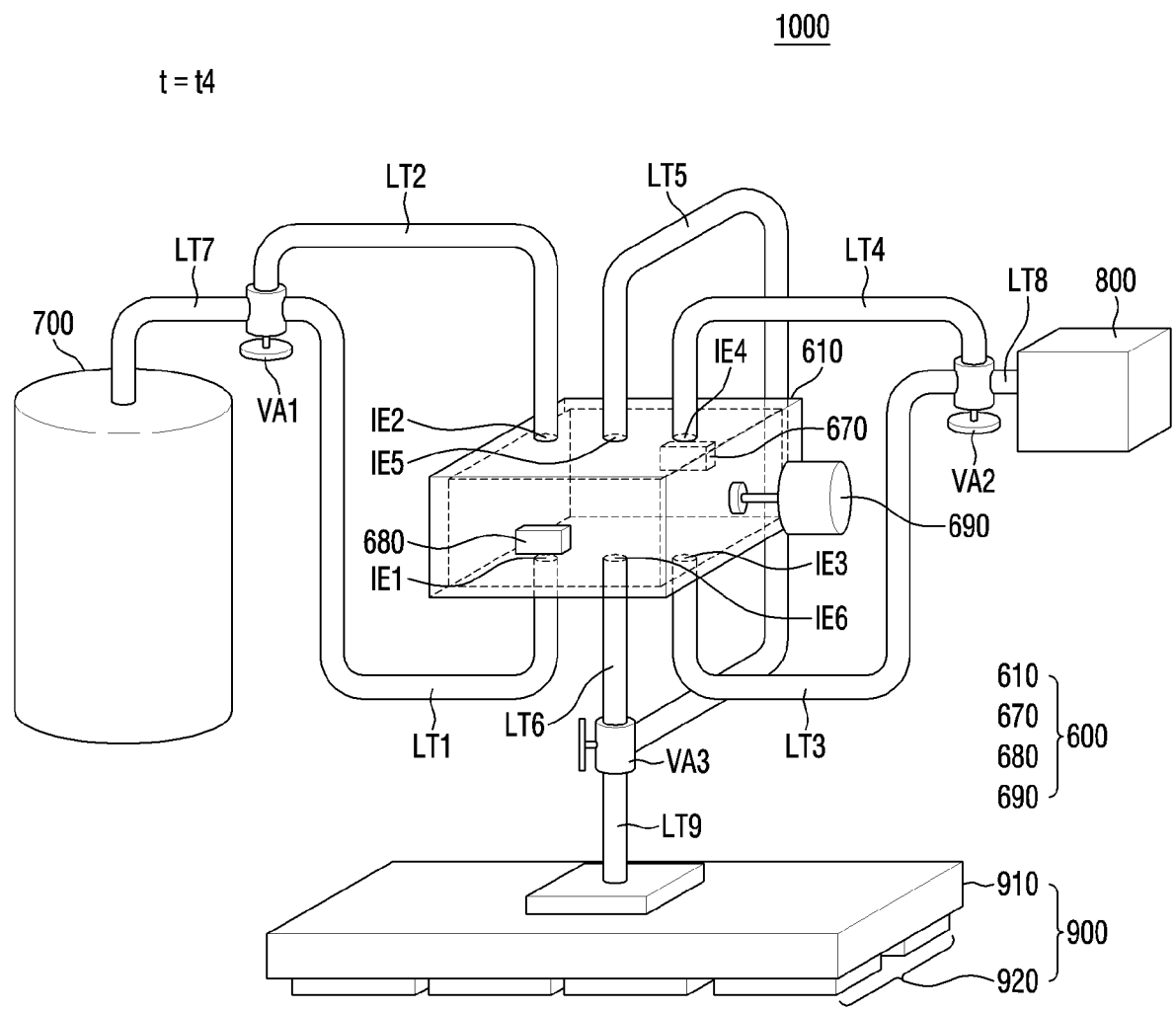
Figure 9:
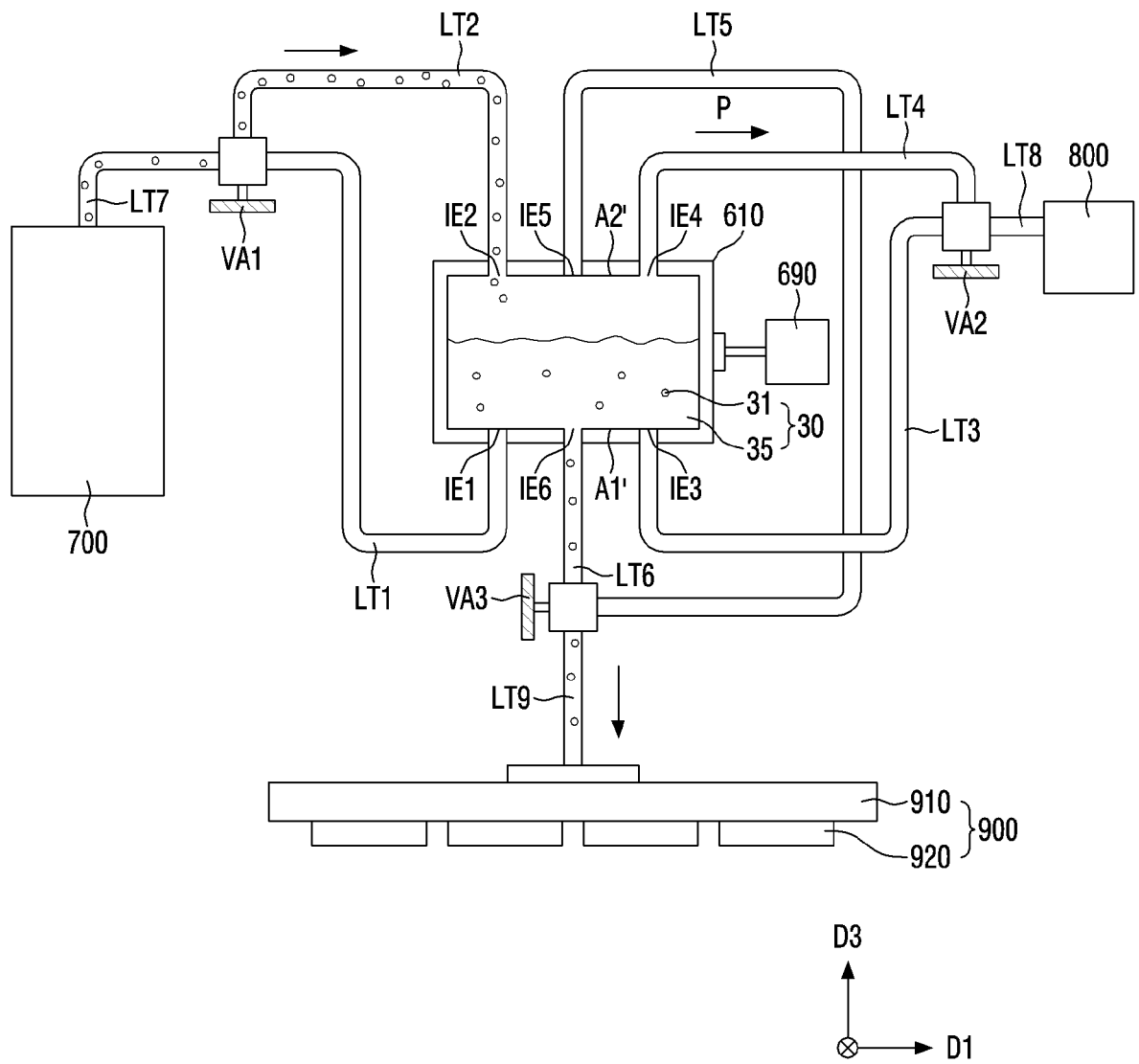
FIG. 9 is a schematic cross-sectional view of the inkjet printing device of FIG. 8.

FIGS. 7 and 8 are schematic perspective views according to driving states of the inkjet printing device according to an embodiment. FIG. 9 is a schematic cross-sectional view of the inkjet printing device of FIG. 8. FIG. 7 illustrates a state of the inkjet printing device 1000 at a third point in time (t=t3), and FIGS. 8 and 9 illustrate a state of the inkjet printing device 1000 at a fourth point in time (t=t4).

According to an embodiment, the ink reservoir 600 may rotate about an axis of rotation that is the same as the axis of rotation of the driver 690, and the axis of rotation of the driver 690 may be in a direction different from the direction in which gravity is applied. For example, the driver 690 may rotate with a direction different from the third direction D3 which is the direction in which gravity is applied, e.g., the first direction D1 or the second direction D2, as the axis of rotation.

In FIGS. 8 and 9, in the inkjet printing device 1000, the ink reservoir 600 may rotate due to operation of the driver 690, and a position of each valve VA may be changed from FIG. 2. However, the position or shape of each valve VA illustrated in the drawings is only an example to show rotation of the ink reservoir 600, and the inkjet printing device 1000 is not limited to the structure illustrated in the drawings.

Referring to FIGS. 7 to 9, in case that the particles 31 in the ink reservoir 600 precipitate or settle, the sensors 670 and 680 may sense this, and the driver 690 may begin rotating. Since a direction in which the particles 31 precipitate is the same as the direction of gravity, the ink reservoir 600 may be rotated in a direction that is not parallel to the direction of gravity. In an embodiment, the driver 690 may rotate the ink reservoir with respect to a rotation axis, and the rotation axis may be a driving shaft of the driver. The driving shaft may be disposed on a reference plane that is perpendicular to or tilted at an acute angle from the direction of gravity acting on the ink 30, as an axis of rotation. The direction in which the driver 690 is driven or rotated may be different from a direction in which gravity is applied to the axis of rotation, e.g., the third direction D3. Accordingly, the ink reservoir 600 may rotate in the same direction as the driver 690, and the direction in which the particles 31 precipitate due to gravity applied thereto may be changed.

For example, as in FIGS. 2 and 5, at the first point in time (t=t1) and the second point in time (t=t2), gravity may be applied to the ink 30 and the particles 31 may precipitate or settle toward the second surface A2' of the ink reservoir 600. At the third point in time (t=t3), the ink reservoir 600 rotates due to operation of the driver 690. After the ink reservoir 600 is rotated as in FIGS. 8 and 9, at the fourth point in time (t=t4), the gravity applied to the ink 30 may be in a direction toward a first surface A1' of the ink reservoir 600, and the particles 31 may also be moved toward the first surface A1'. Accordingly, as the particles 31 precipitated on the second surface A2' are moved toward the first surface A1', the particles 31 may be dispersed again in the solvent 35 of the ink 30. At the fourth point in time (t=t4), the particles 31 which are dispersed in the ink 30 again may be delivered to the inkjet head part 900, and the number of particles 31 included per ink 30 droplet discharged through the nozzle 925 may increase again.

In the inkjet printing device 1000, the operation in which the sensors 670 and 680 of the ink reservoir 600 sense the degree of dispersion of the particles 31 and the driver 690 is operated may be repeated multiple times. The sensors 670 and 680 of the ink reservoir 600 may continuously measure the degree of dispersion of the particles 31 in the ink 30 during the process, and in a case in which the degree of dispersion of the particles 31 decreases to a level or lower, the driver 690 may perform rotation. Accordingly, even in case that the ink 30 contains the particles 31 that may precipitate or settle, the inkjet printing device 1000 may repeat the process and thus maintain the initial set degree of dispersion of the particles 31. Also, the number of particles 31 in the ink 30 ejected onto the target substrate SUB may be maintained to improve the quality of the end-products.

Due to rotation of the ink reservoir 600, the pipes LT and the outlets IE through which the ink tank 700, the pressure controller 800, and the inkjet head part 900 are connected to the ink reservoir 600 may be changed. According to an embodiment, one or more outlets IE of the ink reservoir 600 may be simultaneously connected to at least one of the ink tank 700, the pressure controller 800, and the inkjet head part 900. In the inkjet printing device 1000, according to the process operations, individual components may be connected to the ink reservoir 600 through different pipes LT and outlets IE.

For example, the housing 610 may include the first outlet IE1 and the second outlet IE2 that are connected to the ink tank 700 through a pipe LT, the third outlet IE3 and the fourth outlet IE4 that are connected to the pressure controller 800 through a pipe LT, and the fifth outlet IE5 and the sixth outlet IE6 that are connected to the inkjet head part 900 through a pipe LT. The outlets IE may supply or deliver the ink 30 or transmit a pressure to the housing 610 according to a point in time at which the inkjet printing device 1000 is driven.

The connection between the ink tank 700 and the ink reservoir 600 will be described as an example. As in FIG. 2, at the first point in time (t=t1) of the inkjet printing device 1000, the ink tank 700 is connected to the ink reservoir 600 through the seventh pipe LT7 and the first pipe LT1. As in FIG. 8, at the fourth point in time (t=t4), the ink tank 700 is connected to the ink reservoir 600 through the seventh pipe LT7 and the second pipe LT2. According to the rotation of the ink reservoir 600, the pipe LT performing the same function of supplying the ink 30 may be changed.

Also, at the first point in time (t=t1), the ink 30 is supplied to the housing 610 through the first outlet IE1, the pressure is transmitted through the third outlet IE3, and the ink 30 of the housing 610 is delivered to the inkjet head part 900 through the fifth outlet IE5. At the fourth point in time (t=t4), the ink 30 is supplied or delivered through the second outlet IE2 and the sixth outlet IE6, and the pressure is transmitted through the fourth outlet IE4.

For example, at each point in time (t), the ink 30 may be supplied through the outlet IE disposed in an upper surface in the drawings and may be delivered to the inkjet head part 900 through the outlet IE disposed in a lower surface in the drawings. According to an embodiment, the ink tank 700, the pressure controller 800, and the inkjet head part 900 may be connected to the ink reservoir 600 through different outlets IE or pipes LT. The ink tank 700, the pressure controller 800, and the inkjet head part 900 may supply or deliver the ink 30 and apply the pressure through different pipes LT and outlets IE according to the process operations of the inkjet printing device 1000. Here, the different pipes LT and outlets IE may perform the same function in the process operations of the inkjet printing device 1000.

Also, according to an embodiment, the inkjet printing device 1000 may include the valves VA, e.g., the first valve VA1, the second valve VA2, and the third valve VA3, and each valve VA may be connected to a single pipe LT connected to the ink tank 700, the pressure controller 800, and the inkjet head part 900 and at least one pipe LT connected to the ink reservoir 600. In one embodiment, each of the valves VA1, VA2, and VA3 may connect any one pipe LT to pipes LT connected to different outlets IE according to the process operations of the inkjet printing device 1000.

For example, the first valve VA1 may be opened so that a flow path of the seventh pipe LT7 connected to the ink tank 700 is connected to a flow path of the first pipe LT1 at the first point in time (t=t1) and may be opened so that the flow path of the seventh pipe LT7 is connected to a flow path of the second pipe LT2 at the fourth point in time (t=t4). Accordingly, the ink 30 may be supplied to the ink reservoir 600 through the first pipe LT1 or the second pipe LT2. Also, at the second point in time (t=t2) and the third point in time (t=t3) at which the ink reservoir 600 rotates, the first valve VA1 may be closed in all directions to block the supply of the ink 30 passing through the seventh pipe LT7.

For example, in the inkjet printing device 1000 according to an embodiment, due to sensing by the sensors 670 and 680 of the ink reservoir 600, each valve VA and the driver 690 may be operated and the ink reservoir 600 may rotate.

Hereinafter, the process operations of the inkjet printing device 1000 will be described in more detail with reference to other drawings.

Figure 10:
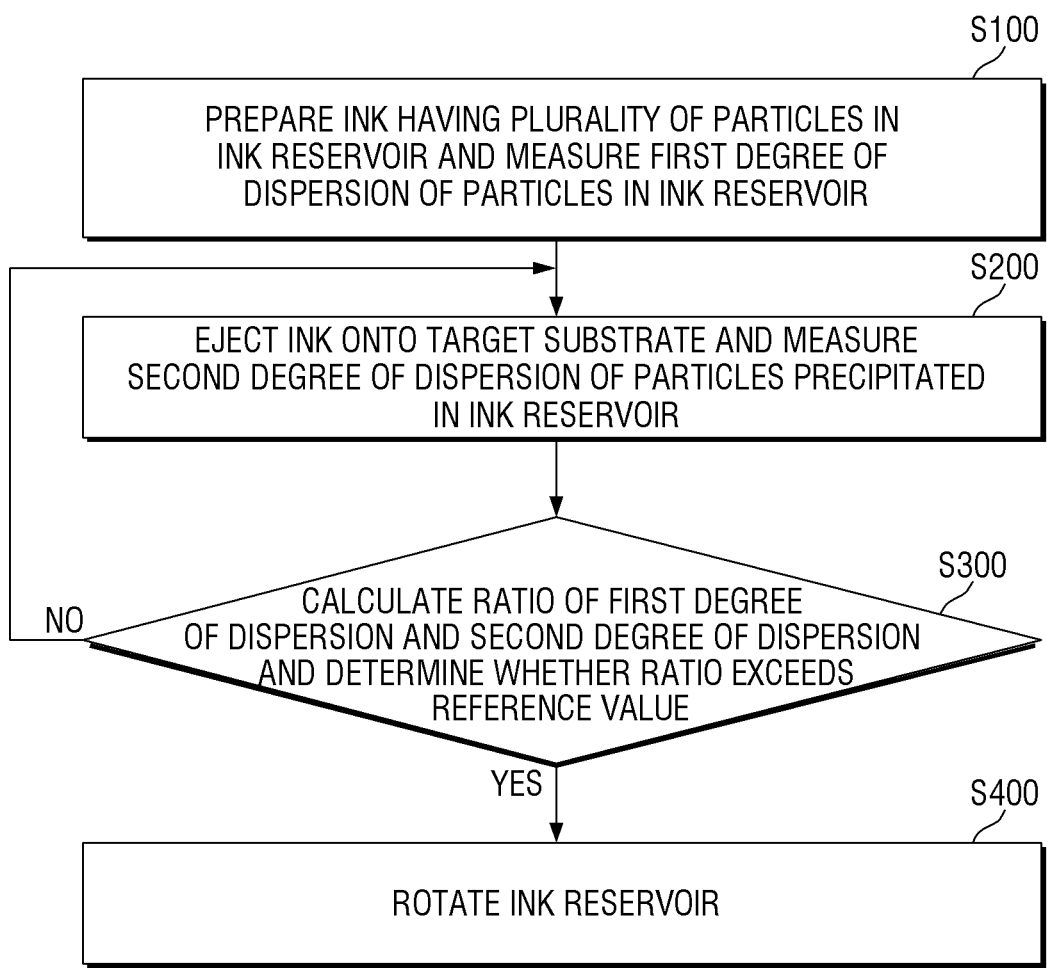
FIG. 10 is a flowchart illustrating an ink ejecting method using the inkjet printing device according to an embodiment.

FIG. 10 is a flowchart illustrating an ink ejecting method using the inkjet printing device according to an embodiment. FIGS. 11 to 14 are cross-sectional views schematically illustrating the ink ejecting method using the inkjet printing device according to an embodiment. FIGS. 11 to 14 schematically illustrate the process operations of the inkjet printing device 1000, focusing on the ink reservoir 600.

For example, in FIGS. 11 to 14, the ink tank 700, the pressure controller 800, and the inkjet head part 900 are omitted, and the other drawings described above should be referenced for descriptions thereof. Also, in FIGS. 11 to 14, the ink reservoir 600 is illustrated as a cross-section that cuts across the sensors 670 and 680, and the driver 690 is omitted. Hereinafter, operation of the ink reservoir 600 will be described in detail in relation to a method of ejecting the ink 30.

Referring to FIGS. 10 to 14, the method of ejecting the ink 30 according to an embodiment may include an operation (S100) in which the ink 30 having the particles 31 is prepared in the ink reservoir 600 and a first degree of dispersion of the particles 31 in the ink reservoir 600 is measured, an operation (S200) in which the ink 30 is ejected onto the target substrate SUB and a second degree of dispersion of the particles 31 precipitating in the ink reservoir 600 is measured, and an operation (S400) in which, in case that a ratio of the first degree of dispersion and the second degree of dispersion is calculated and the ratio exceeds a reference value (S300), the ink reservoir 600 is rotated.

Figure 11:
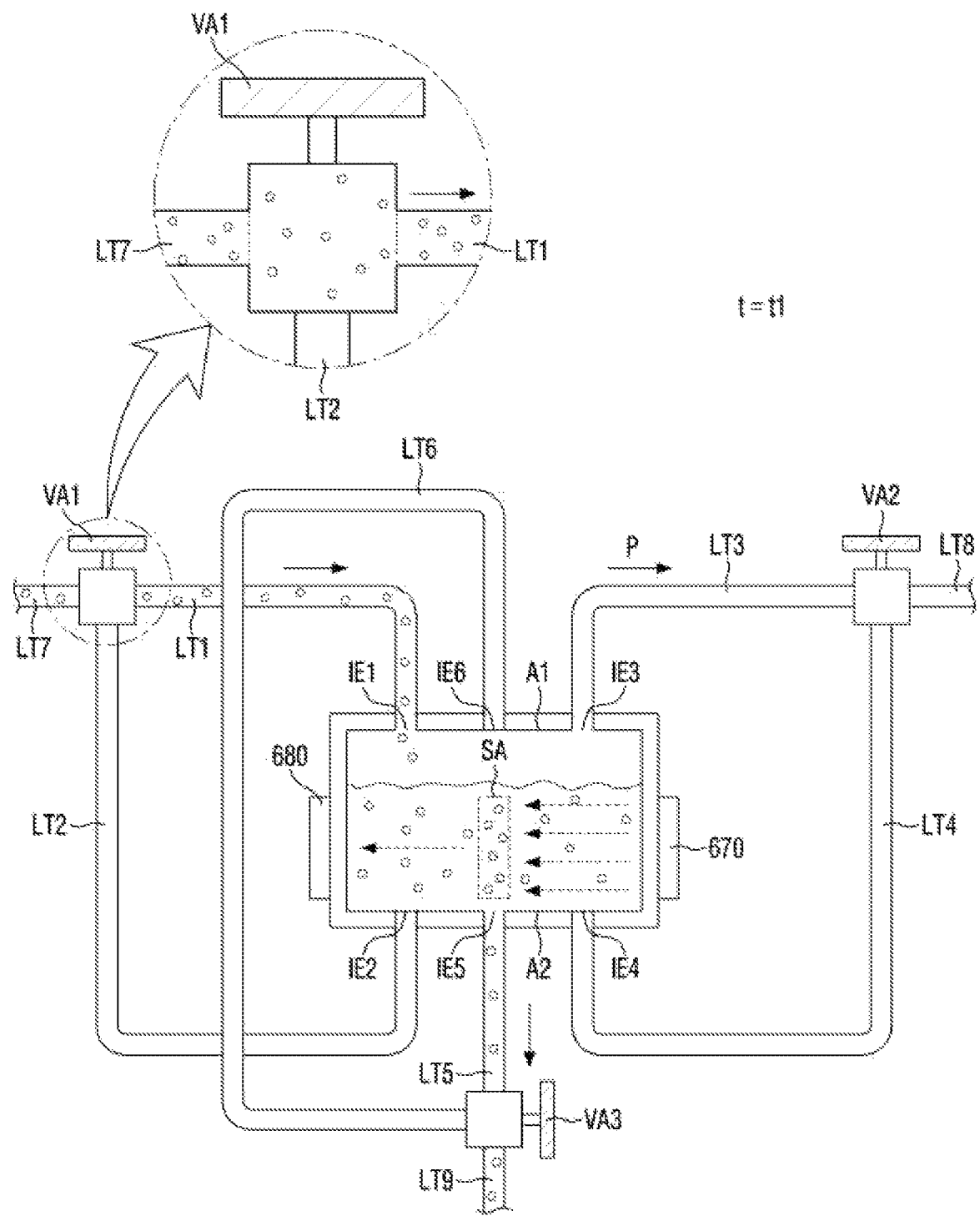
FIGS. 11 to 14 are schematic cross-sectional views schematically illustrating the ink ejecting method using the inkjet printing device according to an embodiment.

First, as illustrated in FIG. 11, at the first point in time (t=t1), the ink 30 containing the particles 31 is prepared in the ink reservoir 600 of the inkjet printing device 1000 (S100). The ink 30 may be supplied to the first outlet IE1 through the seventh pipe LT7, which is connected to the ink tank 700, and the first pipe LT1.

As described above, the inkjet printing device 1000 may include pipes LT and valves VA, and according to each process, the valves VA may be opened so that flow paths of pipes LT are connected to each other or may be closed so that the flow paths are blocked. In an embodiment, each valve VA may be a 3-way valve. The sensors 670 and 680 may sense the degree of dispersion of the particles 31 and the operation of each valve VA may be performed due to feedback in accordance with the sensed degree of dispersion.

In the case of FIG. 11, at the first point in time (t=t1) of the inkjet printing device 1000, the first valve VA1 connects the seventh pipe LT7 connected to the ink tank 700 to the first pipe LT1, the second valve VA2 connects the eighth pipe LT8 connected to the pressure controller 800 to the third pipe LT3, and connects the ninth pipe LT9 connected to the inkjet head part 900 to the fifth pipe LT5.

In order to describe the operation of each of the valves VA1, VA2, and VA3, the first valve VA1 will be described as an example. Although not described in detail, the following description may also apply to the second valve VA2 and the third valve VA3.

An enlarged view in FIG. 11 illustrates a case in which the first valve VA1 opens a flow path along the seventh pipe LT7 and the first pipe LT1 and closes a flow path along the second pipe LT2. Accordingly, the ink 30 in the ink tank 700 may be supplied to the first outlet IE1 through the seventh pipe LT7 and the first pipe LT1.

When the ink 30 is prepared in the ink reservoir 600, the first degree of dispersion of the particles 31 in the ink 30 is measured through the sensors 670 and 680 disposed in the ink reservoir 600 (S100). The types of the sensors 670 and 680 are not limited, but FIG. 11 illustrates a case in which the first sensor 670 is a light emitting part and the second sensor 680 is a light receiving part. Light emitted from the first sensor 670 may pass through the ink 30 and may be incident on the second sensor 680, and the second sensor 680 may measure the amount of light incident thereon to calculate the degree of dispersion of the particles 31 in a sensing area SA.

According to an embodiment, the sensing area SA in which the sensors 670 and 680 sense the degree of dispersion of the particles 31 in the ink 30 may have a shape extending in the third direction D3, and the sensors 670 and 680 may measure the degree of dispersion of the particles 31 of the ink 30 in the third direction D3. For example, the sensors 670 and 680 may measure a change in the degree of dispersion of the particles 31 in the ink 30 in the direction of gravity.

As described above, since the particles 31 may precipitate or settle according to the process of the inkjet printing device 1000, the sensors 670 and 680 measure the degree of dispersion of the particles 31 in the third direction D3, e.g., the direction of gravity. As the process time elapses, the degree of dispersion of the particles 31 may vary according to the upper area and the lower area of the sensing area SA, and the sensors 670 and 680 may sense this. In the drawings which will be described below, the sensors 670 and 680 may sense the deviation and control the operation of each valve VA and the driver 690.

Figure 12:
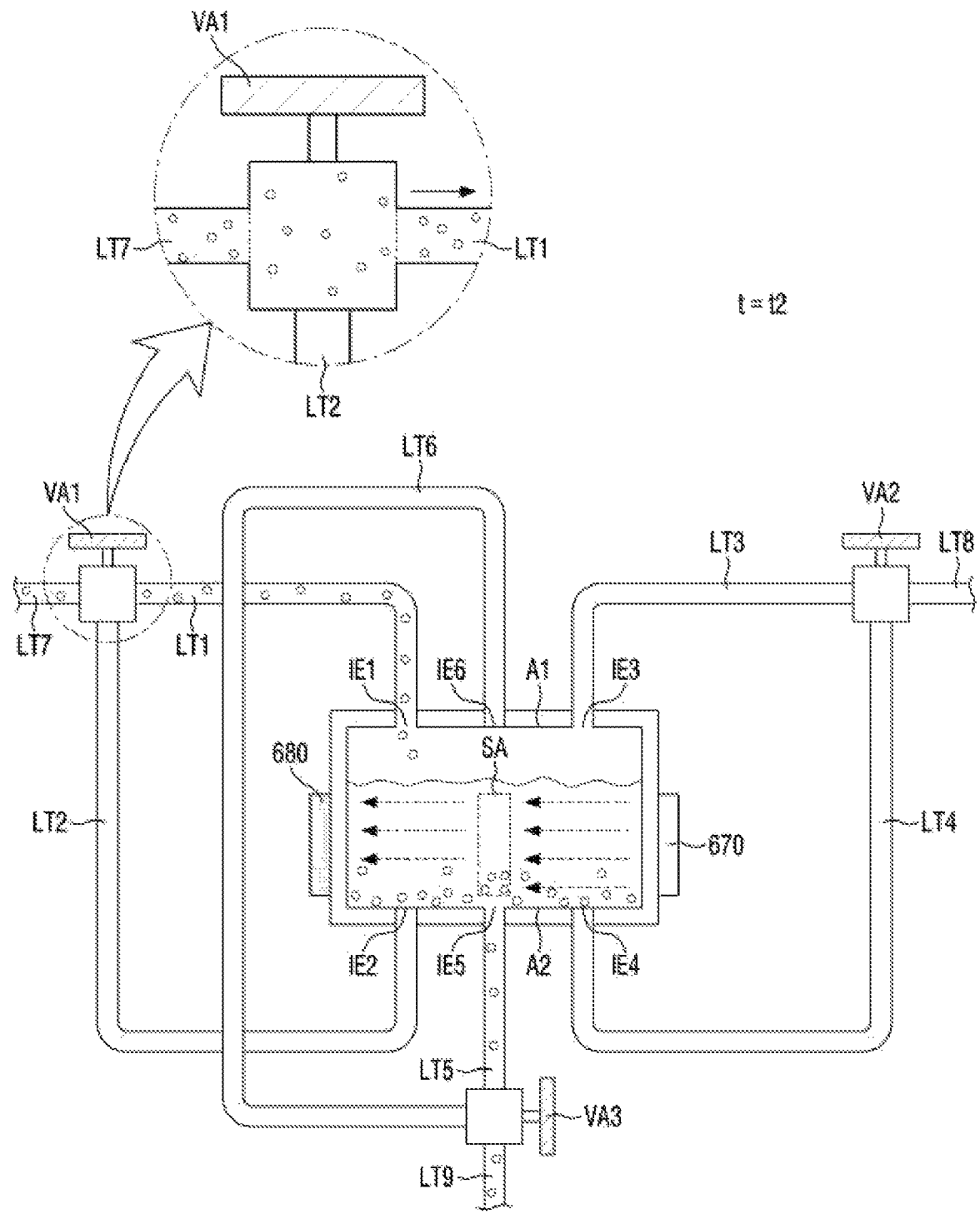

As illustrated in FIG. 12, at the second point in time (t=t2), the sensors 670 and 680 measure the second degree of dispersion of the particles 31 that are precipitating or settling (S200). At the second point in time (t=t2), the particles 31 may precipitate or settle on the second surface A2 of the housing 610 due to gravity. The sensors 670 and 680 may calculate a ratio of the first degree of dispersion measured at the first point in time (t=t1) and the second degree of dispersion measured at the second point in time (t=t2) and may determine whether the ratio exceeds a reference value (S300). The first degree of dispersion measured by the sensors 670 and 680 may be an initial set value of the degree of dispersion of the particles 31 in the ink 30 ejected through the inkjet printing device 1000.

When the particles 31 are dispersed through the inkjet printing device 1000, the ink 30 supplied to the ink reservoir 600 may be supplied so that the degree of dispersion of the particles 31 has the initial set value. In case that the ratio of the first degree of dispersion having the initial set value and the second degree of dispersion measured when the particles 31 precipitate decreases to a reference value or less, the sensors 670 and 680 may sense this and operate the valves VA and the driver 690. Accordingly, while the process is performed multiple times, the inkjet printing device 1000 may minimize the deviation between the degree of dispersion of the particles 31 in the ink 30 and the first degree of dispersion which is the initial set value. In an embodiment, the reference value may be defined as the second degree of dispersion relative to the first degree of dispersion which is the initial set value. The reference value may have a numerical value, which is calculated by dividing the second degree of dispersion by the first degree of dispersion, in a range of about 0.6 to about 0.8. For example, the sensors 670 and 680 may determine whether the second degree of dispersion is lower than a numerical value that is in a range of about 60% to about 80% of the first degree of dispersion. However, the embodiments are not limited thereto.

Figure 13:
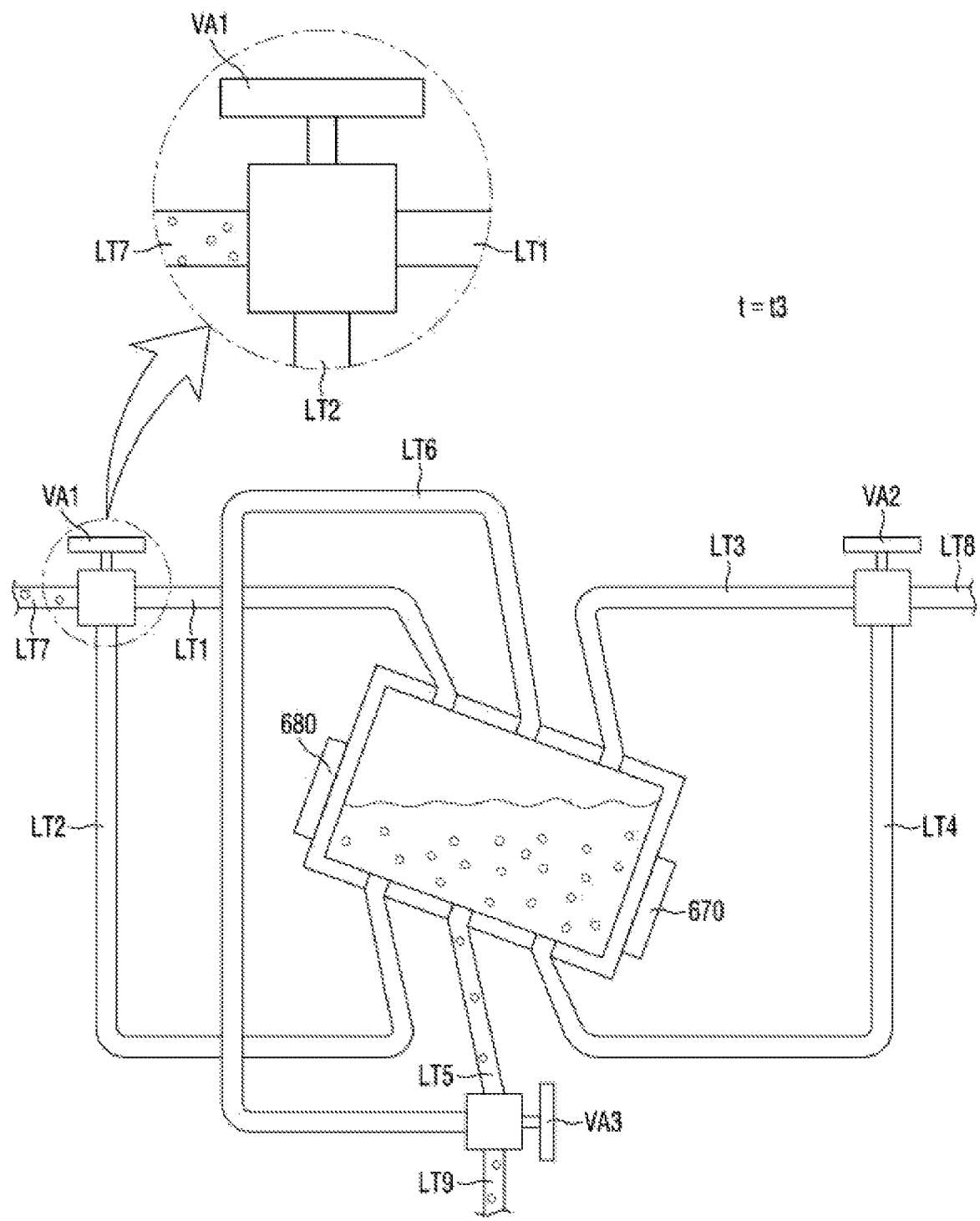

As illustrated in FIG. 13, in case that the second degree of dispersion measured by the sensors 670 and 680 decreases to the reference value or less, the sensors 670 and 680 may control the operation of the valves VA and the driver 690 (not illustrated) (S400).

The sensors 670 and 680 may close the first valve VA1 in all directions so that no more ink 30 is supplied to the ink reservoir 600. As illustrated in the enlarged view in FIG. 13, the first valve VA1 may close the flow path along the seventh pipe LT7 and the first pipe LT1 and the flow path along the second pipe LT2 to block supply of the ink 30. The second valve VA2 and the third valve VA3 may also be operated identically to the first valve VA1. The operations in which the valves VA are closed in all directions may be performed between the second point in time (t=t2) and the third point in time (t=t3) or simultaneously performed at the third point in time (t=t3). In case that all the flow paths are closed by each valve VA, the sensors 670 and 680 may drive the driver 690 to rotate the ink reservoir 600 in an axis of rotation that is not parallel to the direction of gravity, e.g., a direction other than the third direction D3.

Figure 14:
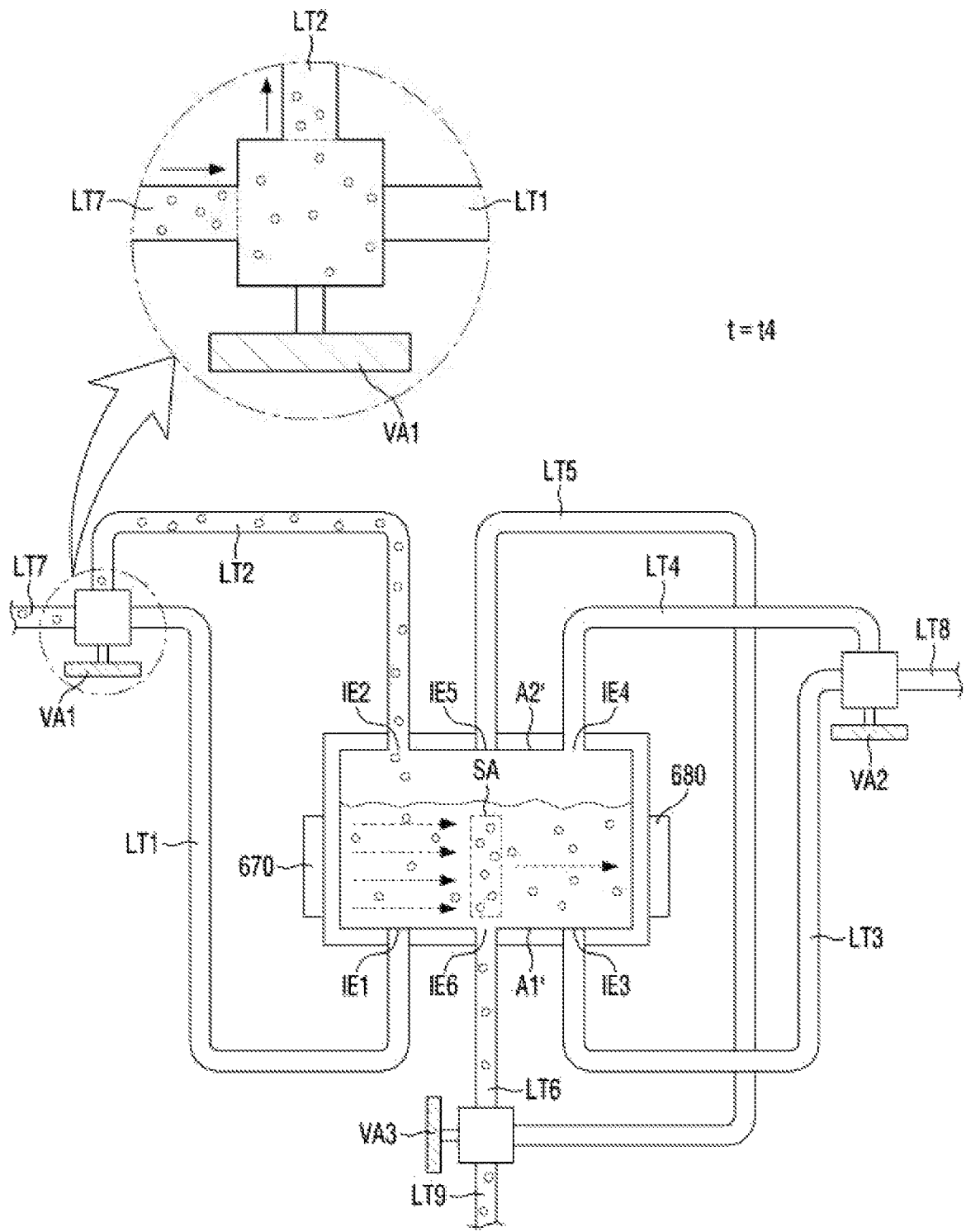

Referring to FIG. 14, at the fourth point in time (t=t4), in the ink 30 of the ink reservoir 600, gravity may be applied to the first surface A1' and the particles 31 may also be moved toward the first surface A1'. The particles 31 precipitated at the second point in time (t=t2) may be dispersed in the ink 30 again due to gravity, and the degree of dispersion of the particles 31 in the ink 30 discharged from the inkjet head part 900 may be at a similar level to that in the ink 30 at the first point in time (t=t1).

Each valve VA, e.g., the first valve VA1, may open a flow path along the second pipe LT2 that is connected to the second outlet IE2 to which the ink 30 is supplied due to rotation of the ink reservoir 600. As illustrated in the enlarged view in FIG. 14, the first valve VA1 may open the flow path along the seventh pipe LT7 and the second pipe LT2 and block the flow path along the first pipe LT1. Accordingly, unlike the first point in time (t=t1), the ink 30 may be supplied to the second outlet IE2 through the seventh pipe LT7 and the second pipe LT2. Although not illustrated in the drawings, the second valve VA2 and the third valve VA3 may be identically operated. For example, the pressure P of the pressure controller 800 may be transmitted to the fourth outlet IE4 through the eighth pipe LT8 and the fourth pipe LT4, and the inkjet head part 900 may receive the ink 30 through the sixth pipe LT6 and the ninth pipe LT9.

The sensors 670 and 680 may continuously measure the degree of dispersion of the particles 31 even after the fourth point in time (t=t4). The sensors 670 and 680 may calculate a ratio of the degree of dispersion measured at each point in time (t) and the first degree of dispersion and continuously determine whether the ratio exceeds the reference value. In a case in which the ratio exceeds the reference value, the ink reservoir 600 may be rotated to maintain the degree of dispersion of the particles 31 in the ink 30. Therefore, the inkjet printing device 1000 according to an embodiment may include the rotatable ink reservoir 600 and maintain the quality of the ink 30 that is ejected or discharged.

The structure of the inkjet printing device 1000 according to an embodiment is not limited as long as the structure is able to maintain a dispersed state of the ink 30 of the ink reservoir 600. For example, the inkjet printing device 1000 according to an embodiment may have any structure as long as the ink reservoir 600 is rotatable and there are outlets IE connected to the same component. Also, in some cases, the pipes LT may not be connected to each outlet IE, each component may be connected to the ink reservoir 600 through a single pipe LT, and the pipes LT may be connected to different outlets IE of the ink reservoir 600.

Figure 15:
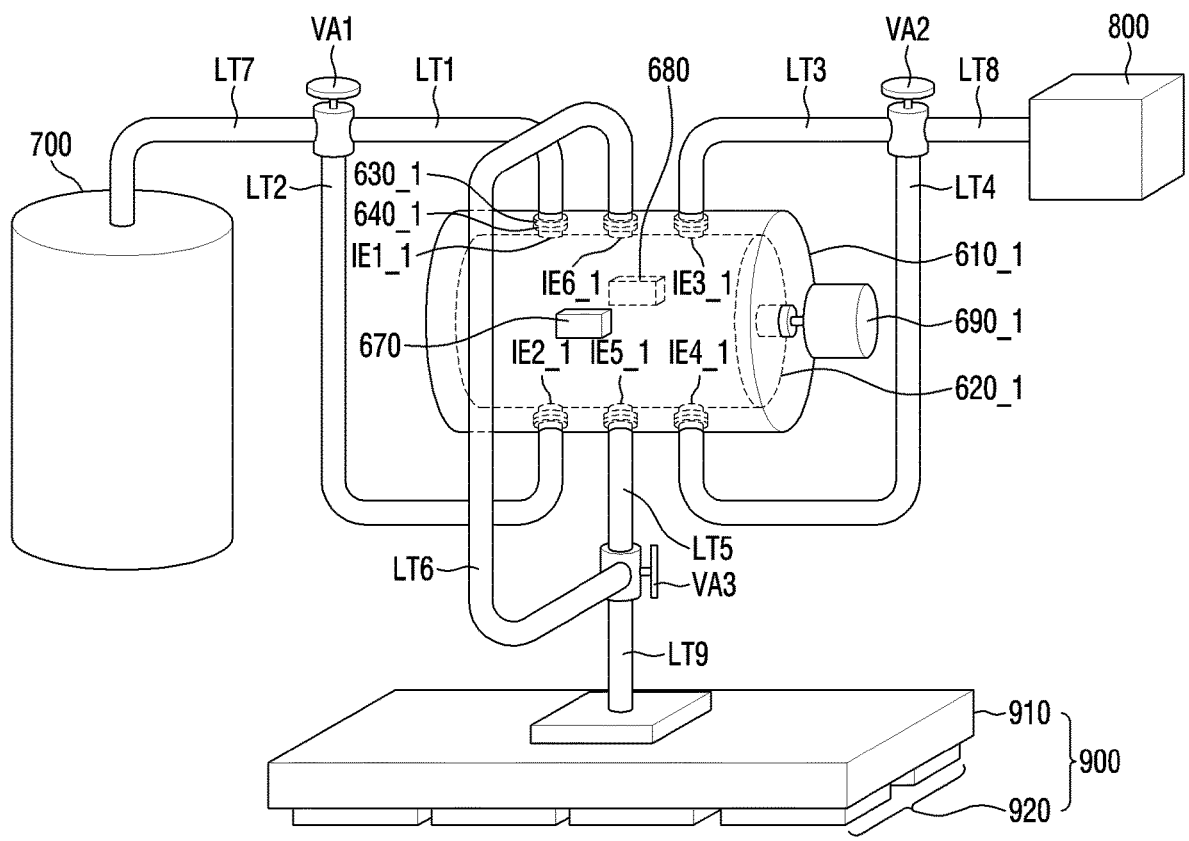
FIG. 15 is a schematic perspective view of an inkjet printing device according to another embodiment.
Figure 16:
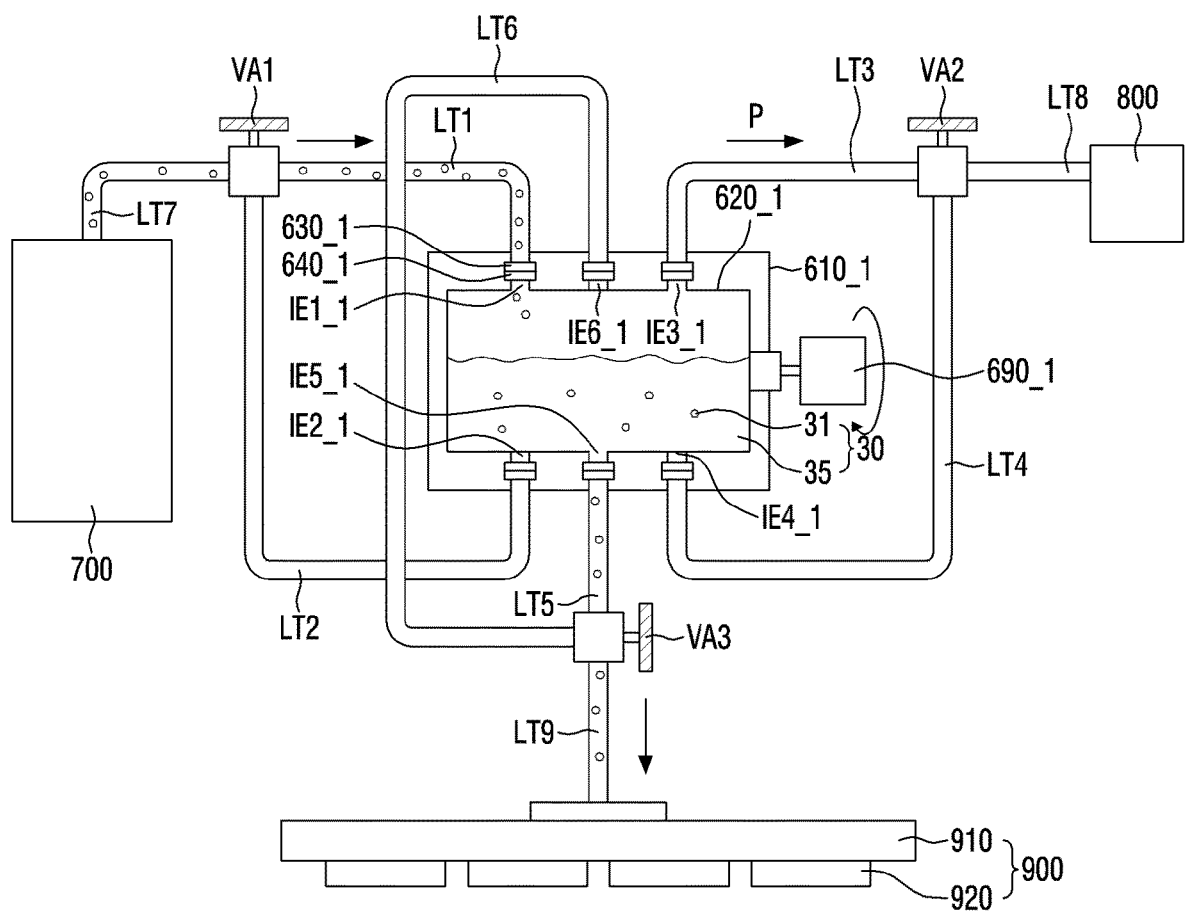
FIG. 16 is a schematic cross-sectional view illustrating the inkjet printing device of FIG. 15.

FIG. 15 is a schematic perspective view of an inkjet printing device according to an embodiment. FIG. 16 is a schematic cross-sectional view illustrating the inkjet printing device of FIG. 15.

Referring to FIGS. 15 and 16, an ink reservoir 600_1 of an inkjet printing device 1000_1 according to an embodiment may include housings 610_1 and 620_1, and each outlet IE_1 may include fastening parts 630_1 and 640_1 disposed between the housings 610_1 and 620_1. A driver 690_1 may rotate only one of the housings 610_1 and 620_1, and the other housing may be fixed.

For example, the ink reservoir 600_1 of FIG. 15 may include a first housing 610_1 and a second housing 620_1, and the ink 30 may be supplied into the second housing 620_1. The first housing 610_1 and the second housing 620_1 may have substantially the same shape, and the shape may be a cylindrical shape that extends in the same direction as an axis of rotation of the driver 690_1. However, the embodiments are not limited thereto. Since the housings 610_1 and 620_1 have the cylindrical shape, the ink reservoir 600_1 may have a cylindrical shape as a whole.

The first housing 610_1 may be formed to surround an outer surface of the second housing 620_1, and the first housing 610_1 and the second housing 620_1 may be separated from each other. For example, unlike in the inkjet printing device 1000 of FIG. 1, according to an embodiment, the ink reservoir 600_1 may include the separate housings 610_1 and 620_1, and at least one of the housings 610_1 and 620_1, e.g., the first housing 610_1, may be fixed and the second housing 620_1 may rotate in one direction.

As described above, the ink reservoir 600 may include the driver 690 to control the degree of dispersion of the particles 31 that precipitate or settle and may rotate in one direction, e.g., the direction opposite to the direction of gravity. As the pipes LT connected to the ink reservoir 600 rotate, the pipes LT may cross each other. In the case of the ink reservoir 600_1 of FIGS. 15 and 16, the position of the first housing 610_1 may be fixed, and only the second housing 620_1 to which the ink 30 is supplied may rotate, and thus the positions of the pipes LT connected to the ink reservoir 600_1 may be maintained. For example, the driver 690_1 of the ink reservoir 600_1 may be disposed in the second housing 620_1 and transmit a rotational force only to the second housing 620_1 by rotation.

According to an embodiment, the fastening parts 630_1 and 640_1 that connects the first housing 610_1 and the second housing 620_1, which are separated from each other, may be disposed at the outlets IE_1 of the ink reservoir 600_1.

A first fastening part 630_1 is disposed on the first housing 610_1, and a second fastening part 640_1 is disposed on the second housing 620_1. The number of first fastening parts 630_1 and the number of second fastening parts 640_1 may be the same as the number of outlets IE_1. In a case in which the ink reservoir 600_1 includes first to sixth outlets IE1_1, IE2_1, IE3_1, IE4_1, IE5_1, and IE6_1, the number of first fastening parts 630_1 and the number of second fastening parts 640_1 may be six. However, the embodiments are not limited thereto.

The first fastening part 630_1 may be disposed to be adjacent to pipes LT, e.g., first to sixth pipes LT1, LT2, LT3, LT4, LT5, and LT6, that are connected to the outlets IE_1. The second fastening part 640_1 is disposed opposite to the first fastening part 630_1. Although not illustrated in the drawings, the first fastening part 630_1 and the second fastening part 640_1 may also include a blocking component disposed at the outlet IE_1.

The first fastening part 630_1 and the second fastening part 640_1 may perform an operation of being connected to or separated from each other to control the movement of the ink 30 or the transmission of the pressure P. The first fastening part 630_1 and the second fastening part 640_1 may perform substantially the same function as the above-described valves VA. According to the process operations of the inkjet printing device 1000_1, the sensors 670 and 680 may sense the degree of dispersion of the particles 31 and control operations of each valve VA, the driver 690_1, and the fastening parts 630_1 and 640_1.

Figure 17:
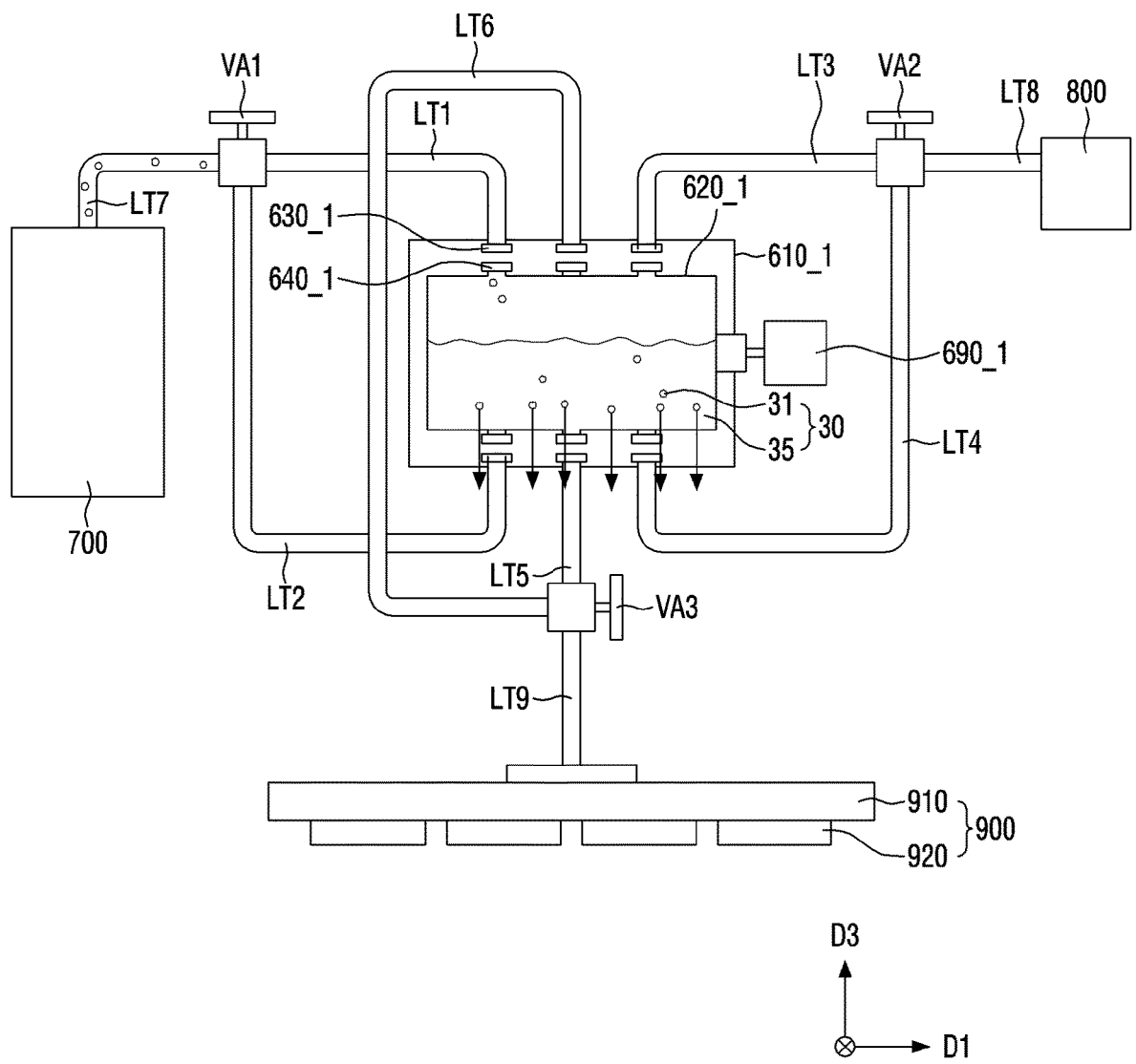
FIGS. 17 to 19 are schematic views illustrating structures according to process operations of the inkjet printing device according to another embodiment.
Figure 18:
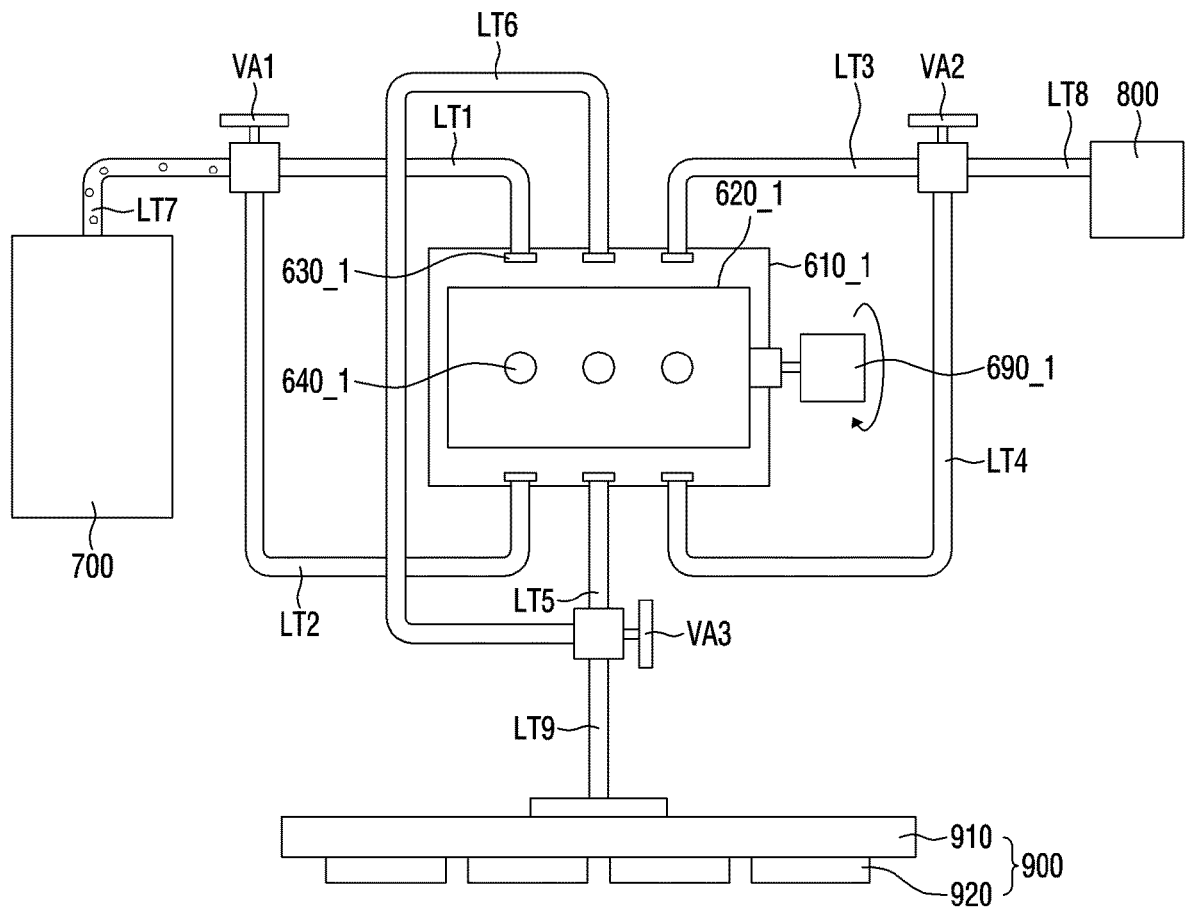
Figure 19:
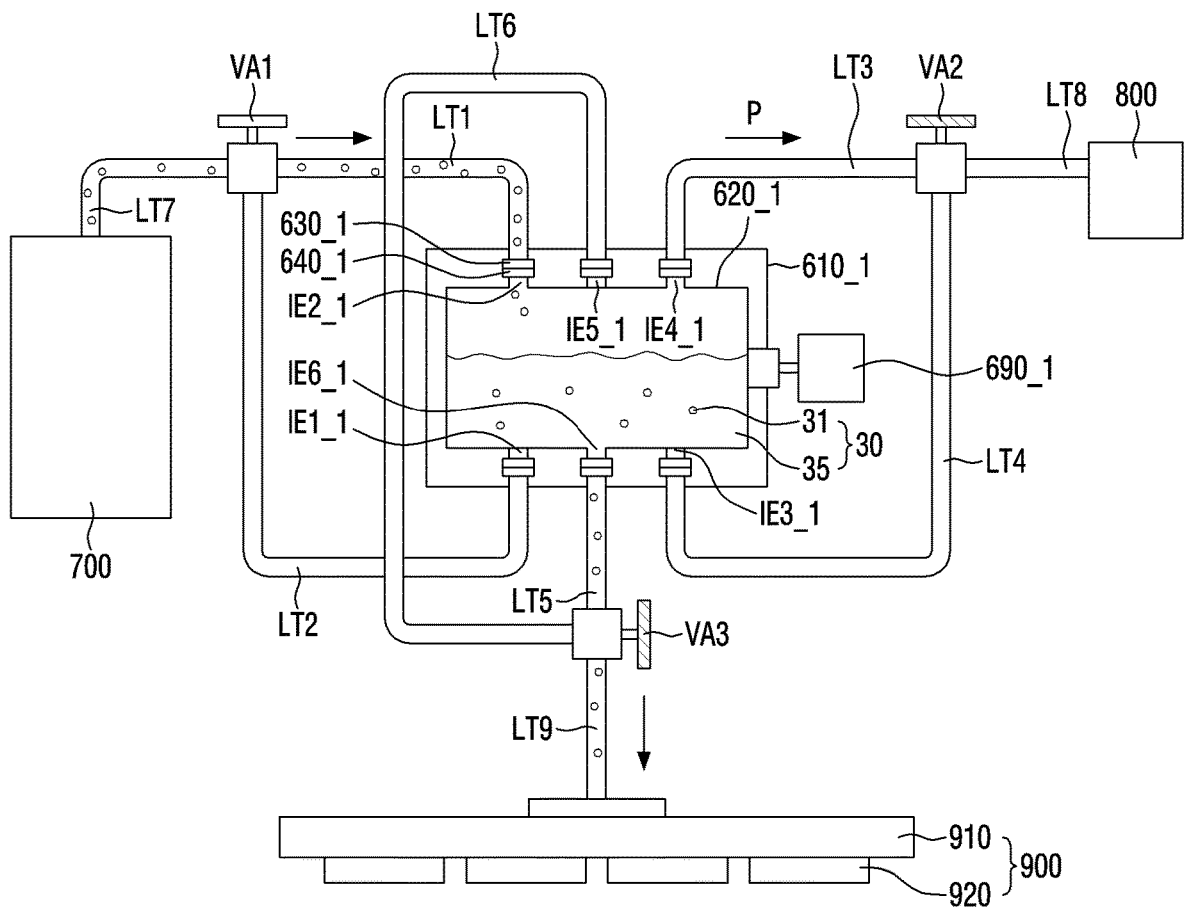

FIGS. 17 to 19 are schematic views illustrating structures according to process operations of the inkjet printing device according to an embodiment.

The process of the inkjet printing device 1000_1 of FIG. 15 will be described with reference to FIGS. 16 to 19. First, as illustrated in FIG. 16, at the first point in time (t=t1) of the inkjet printing device 1000_1, the first fastening part 630_1 and the second fastening part 640_1 may be connected and the ink 30 may be supplied or the pressure P may be transmitted to the ink reservoir 600_1. The first point in time (t=t1) refers to a state in which the degree of dispersion of the particles 31 that is sensed by the sensors 670 and 680 does not exceed the reference value, and the first fastening part 630_1 and the second fastening part 640_1 may be connected to each other at the first point in time (t=t1). Here, each valve VA may deliver the ink 30 or transmit the pressure P to the ink reservoir 600_1 through the first pipe LT1, the third pipe LT3, and the fifth pipe LT5.

As illustrated in FIG. 17, at the second point in time (t=t2), in a case in which the degree of dispersion of the particles 31 that is sensed by the sensors 670 and 680 is less than or equal to the reference value, the sensors 670 and 680 may sense this and control the operation of the valves VA and the fastening parts 630_1 and 640_1. As illustrated in the drawing, each valve VA may block the connection between different pipes LT, and the first fastening part 630_1 and the second fastening part 640_1 may also be separated from each other to block delivery of the ink 30 or transmission of the pressure P to the ink reservoir 600_1. The operation in which each valve VA is closed and the fastening parts 630_1 and 640_1 are separated may be performed at the second point in time (t=t2) or between the second point in time (t=t2) and the third point in time (t=t3).

As illustrated in FIG. 18, in case that the delivery of the ink 30 and the transmission of the pressure P are blocked by each valve VA and the fastening parts 630_1 and 640_1, the driver 690_1 is driven to rotate the second housing 620_1. The second housing 620_1 may rotate in the third direction D3, e.g., the direction opposite to the direction of gravity, and the precipitated particles 31 may be dispersed again.

Lastly, as illustrated in FIG. 19, in case that rotation of the second housing 620_1 is completed, each valve VA may be opened again in one direction and the fastening parts 630_1 and 640_1 may be connected to each other such that the ink 30 is delivered or the pressure P is transmitted to the ink reservoir 600_1. Here, when the first fastening part 630_1 and the second fastening part 640_1 are connected again, an angle of rotation of the driver 690_1 may be controlled to prevent a leak from occurring between the first fastening part 630_1 and the second fastening part 640_1. The inkjet printing device 1000_1 may further include a sensing unit that senses a state of the driver 690_1 to control a rotational state of the driver 690_1 between the first point in time (t=t1) and the fourth point in time (t=t4). However, the embodiments are not limited thereto.

In the inkjet printing device 1000_1 of FIG. 15, unlike in FIG. 1, the ink reservoir 600_1 includes the housings 610_1 and 620_1, and each outlet IE_1 includes the fastening parts 630_1 and 640_1 so that only one of the housings 610_1 and 620_1 may rotate. In this way, the degree of dispersion of the particles 31 in the ink 30 may be maintained, and simultaneously, interference between the pipes LT due to rotation of the ink reservoir 600_1 may be prevented.

Figure 20:
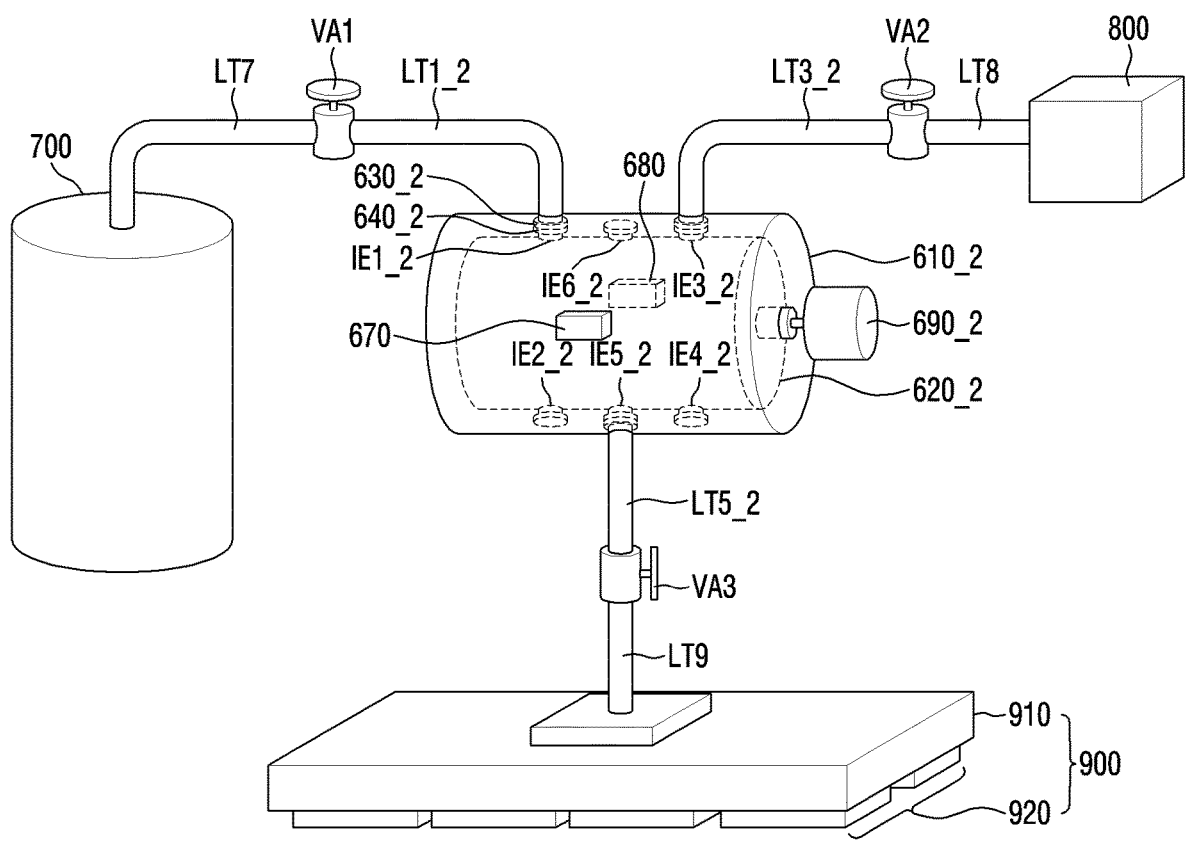
FIG. 20 is a schematic perspective view of an inkjet printing device according to another embodiment.

FIG. 20 is a schematic perspective view of an inkjet printing device according to an embodiment.

An inkjet printing device 1000_2 of FIG. 20 is identical to the inkjet printing device 1000_1 of FIG. 15, except that the second pipe LT2, the fourth pipe LT4, and the sixth pipe LT6 are omitted, and the number of first fastening parts 630_2 is changed. Hereinafter, only the differences will be described.

According to an embodiment, in the inkjet printing device 1000_2, pipes LT_2 may be connected to only some outlets IE_2 of an ink reservoir 600_2, and the outlet IE_2 connected to the pipe LT_2 may be changed according to the process of the inkjet printing device 1000_2.

In the inkjet printing device 1000_2 of FIG. 20, at the first point in time (t=t1), a first pipe LT1_2, a third pipe LT3_2, and a fifth pipe LT5_2 may be connected to a first outlet IE1_2, a third outlet IE3_2, and a fifth outlet IE5_2, respectively. In case that a second housing 620_2 of the inkjet printing device 1000_2 rotates due to sensing by the sensors 670 and 680, the outlets IE_2 connected to the pipes LT_2 may be changed. At the fourth point in time (t=t4, not illustrated) at which the second housing 620_2 is rotated, the first pipe LT1_2, the third pipe LT3_2, and the fifth pipe LT5_2 may be connected to a second outlet IE2_2, a fourth outlet IE4_2, and a sixth outlet IE6_2, respectively. Accordingly, the number of first fastening parts 630_2 disposed on a first housing 610_2 and connected to the first pipe LT1_2, the third pipe LT3_2, and the fifth pipe LT5_2 may be three, and the number of second fastening parts 640_2 that are disposed on the second housing 620_2 and may be connected to the first fastening parts 630_2 may be six. The number of first fastening parts 630_2 may be the same as the number of pipes LT_2 connected to the ink reservoir 600_2, and the number of second fastening parts 640_2 may be the same as the number of outlets IE_2 of the ink reservoir 600_2. Accordingly, in the inkjet printing device 1000_2 according to an embodiment, the one or more pipes LT_2 may perform the same function but be connected to different outlets IE_2.

According to an embodiment, the ink 30 ejected by the inkjet printing device 1000 may include dipoles 31' dispersed in the solvent 35, and the dipoles 31' may have directionality with respect to one direction and thus be aligned in a specific direction after being ejected from the inkjet printing device 1000.

Figure 21:
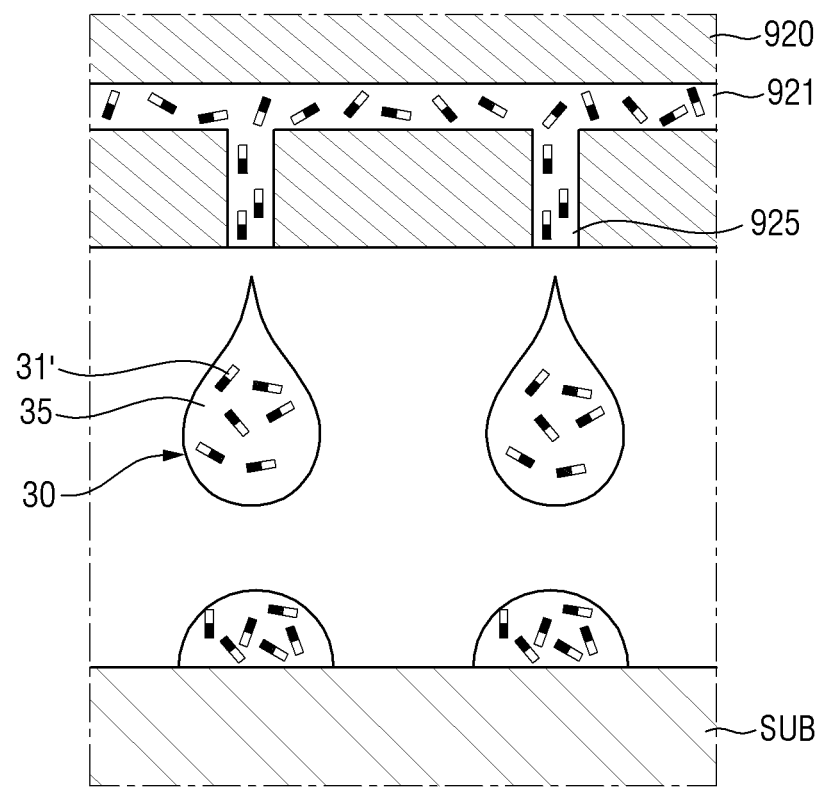
FIGS. 21 and 22 are schematic views illustrating a dipole aligning process using the inkjet printing device according to another embodiment.
Figure 22:
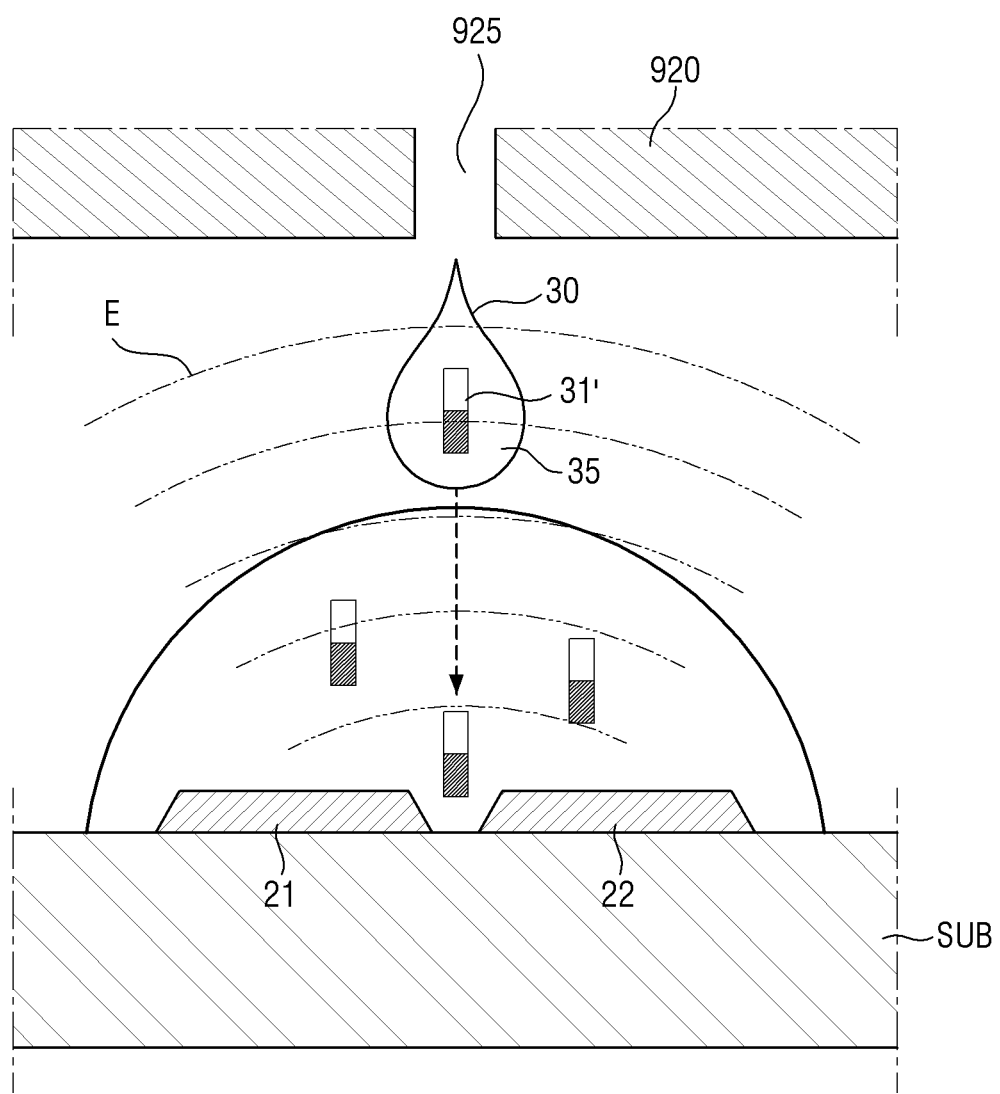

FIGS. 21 and 22 are schematic views illustrating a dipole aligning process using the inkjet printing device according to an embodiment.

The type of particles 31 is not limited, and the inkjet printing device 1000 according to an embodiment may eject the particles 31, which may be dispersed in the solvent 35 and precipitate or settle, onto the target substrate SUB. In an embodiment, the particles 31 may be the dipoles 31' capable of precipitating or settling.

The dipole 31' may be an object that has one end portion having a first polarity and the other end portion having a second polarity different from the first polarity. For example, the one end portion of the dipole 31' may have a positive polarity, and the other end portion of the dipole 31' may have a negative polarity. The dipoles 31' of which both end portions have different polarities may receive an electrical force (attractive force and repulsive force) when placed in an electric field, and a direction in which the dipoles 31' are oriented may be controlled.

Referring to FIGS. 21 and 22, the ink 30 may include the dipoles 31' and may be discharged through the nozzle 925 of the inkjet head part 900. The dipoles 31' in the ink 30 may have directionality due to both end portions thereof having different polarities, e.g., the first polarity and the second polarity. However, as illustrated in FIG. 21, when ejecting the ink 30 containing the dipoles 31', the direction in which the dipoles 31' are oriented may be random in a case in which an external force is not applied. Accordingly, when the ink 30 is ejected onto the target substrate SUB, the dipoles 31' in the ink 30 are oriented in a random direction.

As illustrated in FIG. 22, when an electric field E is applied to the ink 30 when the ink 30 containing the dipoles 31' is discharged, the dipoles 31' in the ink 31 may be oriented in a certain direction and ejected onto the target substrate SUB. Until the ink 30 is ejected from the nozzle 925 onto the target substrate SUB, the dipoles 31' receive an electrical force and are oriented in a direction of the electric field.

In some cases, in an embodiment, electrodes 21 and 22 may be disposed on the target substrate SUB, and the ink 30 discharged through the nozzle 925 may be ejected onto the electrodes 21 and 22. After being ejected onto the target substrate SUB as in FIG. 22, the dipoles 31' may also be oriented in a direction due to an electric field applied through an electrode. When an electrical signal is applied through the electrodes 21 and 22, an electric field may be formed in the ink 30 ejected onto the electrodes 21 and 22, and the dipoles 31' may be affected by the electric field and oriented in a direction. However, the embodiments are not limited thereto.

The above-described dipoles 31' may be light emitting elements including a conductive semiconductor, and according to an embodiment, a display device including the light emitting elements may be manufactured using the inkjet printing device 1000.

Figure 23:
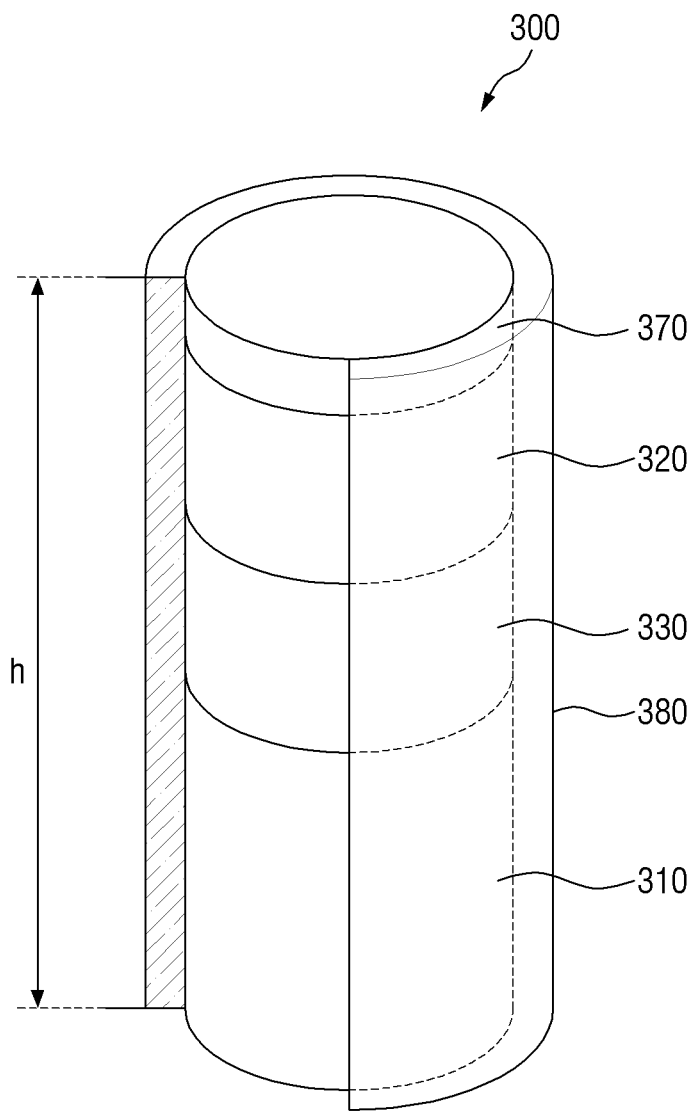
FIG. 23 is a schematic view of a light emitting element according to an embodiment.

FIG. 23 is a schematic view of a light emitting element according to an embodiment.

A light emitting element 300 may include a semiconductor crystal doped with a conductive (e.g., p-type or n-type) impurity. The semiconductor crystal may receive an electrical signal applied from an external power source and emit the received electrical signal as light in a specific wavelength band.

The light emitting element 300 may be a light emitting diode (LED). For example, the light emitting element 300 may be an inorganic LED that has a length h in micro-meters or nano-meters and is made of an inorganic material. In case that the light emitting element 300 is an inorganic LED, when an electric field is formed in a specific direction between two electrodes, the inorganic LED may be aligned between the two electrodes having polarities. The light emitting element 300 may receive an electrical signal from an electrode and emit light in a specific wavelength band.

Referring to FIG. 23, the light emitting element 300 according to an embodiment may include conductive semiconductors 310 and 320, an active layer 330, an electrode material layer 370, and an insulating film 380. The conductive semiconductors 310 and 320 may transmit an electrical signal, which is transmitted to the light emitting element 300, to the active layer 330, and the active layer 330 may emit light in a specific wavelength band.

The light emitting element 300 may include a first conductive semiconductor 310, a second conductive semiconductor 320, the active layer 330 disposed between the first conductive semiconductor 310 and the second conductive semiconductor 320, the electrode material layer 370 disposed on the second conductive semiconductor 320, and the insulating film 380 disposed to surround outer surfaces thereof. The light emitting element 300 of FIG. 23 is illustrated as the first conductive semiconductor 310, the active layer 330, the second conductive semiconductor 320, and the electrode material layer 370 are sequentially formed in a longitudinal direction, but the embodiments are not limited thereto. The electrode material layer 370 may be omitted, or in some embodiments, may be disposed on at least one of both side surfaces of the first conductive semiconductor 310 and the second conductive semiconductor 320. The following description of the light emitting element 300 may identically apply even when the light emitting element 300 further includes another structure.

The first conductive semiconductor 310 may be an n-type semiconductor layer. For example, in a case in which the light emitting element 300 emits light in in the blue wavelength band, the first conductive semiconductor 310 may be a semiconductor material having the chemical formula, $In_xAl_yGa_{1-x-y}N$ ($0 \le x \le 1$, $0 \le y \le 1$, $0 \le x+y \le 1$). For example, the first conductive semiconductor 310 may be any one or more of InAlGaN, GaN, AlGaN, InGaN, AlN, and InN that are doped with an n-type impurity. The first conductive semiconductor 310 may be doped with a first conductive dopant. For example, the first conductive dopant may be Si, Ge, Sn, or the like. A length of the first conductive semiconductor 310 may be in a range of about 1.5 µm to about 5 µm, but the embodiments are not limited thereto.

The second conductive semiconductor 320 may be a p-type semiconductor layer. For example, in a case in which the light emitting element 300 emits light in in the blue wavelength band, the second conductive semiconductor 320 may be a semiconductor material having the chemical formula, $In_xAl_yGa_{1-x-y}N$ ($0 \le x \le 1$, $0 \le y \le 1$, $0 \le x+y \le 1$). For example, the second conductive semiconductor 320 may be any one or more of InAlGaN, GaN, AlGaN, InGaN, AlN, and InN that are doped with a p-type impurity. The second conductive semiconductor 320 may be doped with a second conductive dopant. For example, the second conductive dopant may be Mg, Zn, Ca, Se, Ba, or the like. A length of the second conductive semiconductor 320 may be in a range of about 0.08 µm to about 0.25 µm, but the embodiments are not limited thereto.

Although the first conductive semiconductor 310 and the second conductive semiconductor 320 constitute a single layer in the drawing, the embodiments are not limited thereto. In some cases, according to a material of the active layer 330 which will be described below, the first conductive semiconductor 310 and the second conductive semiconductor 320 may also include more layers.

The active layer 330 is disposed between the first conductive semiconductor 310 and the second conductive semiconductor 320 and may include a material having a single or multiple quantum well structure. In a case in which the active layer 330 includes a material having the multiple quantum well structure, the active layer 330 may have a structure in which quantum layers and well layers are alternately stacked. The active layer 330 may emit light by combining electron-hole pairs according to an electrical signal applied through the first conductive semiconductor 310 and the second conductive semiconductor 320. For example, in a case in which the active layer 330 emits light in the blue wavelength band, the active layer 330 may include materials such as AlGaN and AlInGaN. In case that the active layer 330 has the multiple quantum well structure in which the quantum layers and well layers are alternately stacked, the quantum layer may include materials such as AlGaN or AlInGaN, and the well layer may include materials such as GaN or AlGaN.

However, the embodiments are not limited thereto, and the active layer 330 may have a structure in which semiconductor materials with large band gap energy and semiconductor materials with small band gap energy are alternately stacked, or the active layer 330 may include different Group III-V semiconductor materials according to a wavelength band of light being emitted. The light emitted by the active layer 330 is not limited to light in the blue wavelength band, and in some cases, the active layer 330 may emit light in the red or green wavelength band. A length of the active layer 330 may be in a range of about 0.05 μm to about 0.25 μm, but the embodiments are not limited thereto.

The light emitted from the active layer 330 may not only be emitted to an outer surface of the light emitting element 300 in the longitudinal direction, but also be emitted to both side surfaces of the light emitting element 300. The directionality of the light emitted from the active layer 330 is not limited to one direction.

The electrode material layer 370 may be an ohmic contact electrode. However, the embodiments are not limited thereto, and the electrode material layer 370 may also be a Schottky contact electrode. The electrode material layer 370 may include a conductive metal. For example, the electrode material layer 370 may include at least one of aluminum (Al), titanium (Ti), indium (In), gold (Au), silver (Ag), indium tin oxide (ITO), indium zinc oxide (IZO), and indium tin-zinc oxide (ITZO). The electrode material layer 370 may include the same material or include different materials, but the embodiments are not limited thereto.

The insulating film 380 may be formed to contact the first conductive semiconductor 310, the second conductive semiconductor 320, the active layer 330, and the electrode material layer 370 and to surround outer surfaces thereof. The insulating film 380 may perform a function of protecting the components. For example, the insulating film 380 may be formed to surround side surface portions of the components, and both end portions of the light emitting element 300 in the longitudinal direction may be exposed, but the embodiments are not limited thereto.

The insulating film 380 may include materials having an insulating characteristic, e.g., silicon oxide ($SiO_x$), silicon nitride ($SiN_x$), silicon oxynitride ($SiO_xN_y$), aluminum nitride (AlN), aluminum oxide ($Al_2O_3$), and the like. Accordingly, the insulating film 380 may prevent the electrical short circuit of the active layer 330 that may occur in a case in which the light emitting element 300 directly contacts an electrode to which an electrical signal is transmitted. Also, since the insulating film 380 protects the outer surface of the light emitting element 300 including the active layer 330, the insulating film 380 may prevent the degradation of light emitting efficiency.

In case that the insulating film 380 is formed to extend in the longitudinal direction of the light emitting element 300 and to cover the light emitting element 300 from the first conductive semiconductor 310 to the electrode material layer 370 is illustrated in the drawing, but the embodiments are not limited thereto. The insulating film 380 may cover only the first conductive semiconductor 310, the active layer 330, and the second conductive semiconductor 320 or may cover only a portion of an outer surface of the electrode material layer 370 such that the outer surface of the electrode material layer 370 is partially exposed.

A thickness of the insulating film 380 may be in a range of about 0.5 μm to about 1.5 μm, but the embodiments are not limited thereto.

Also, in some embodiments, an outer surface of the insulating film 380 may be surface-treated. When manufacturing a display device 10 (refer to FIG. 25), the light emitting elements 300, which are dispersed in ink, may be ejected onto an electrode and aligned. Here, in order to maintain a state in which the light emitting elements 300 are dispersed in the ink without aggregating with other adjacent light emitting elements 300, the surface of the insulating film 380 may be treated to be hydrophobic or hydrophilic.

The light emitting element 300 may have a shape extending in one direction. The light emitting element 300 may have the shape of a nano-rod, a nano-wire, a nano-tube, or the like. In an embodiment, the light emitting element 300 may have a cylindrical or rod-like shape. However, the shape of the light emitting element 300 is not limited thereto and may be various other shapes such as a cubic shape, a rectangular parallelepiped shape, or a hexagonal prism shape.

Figure 24:
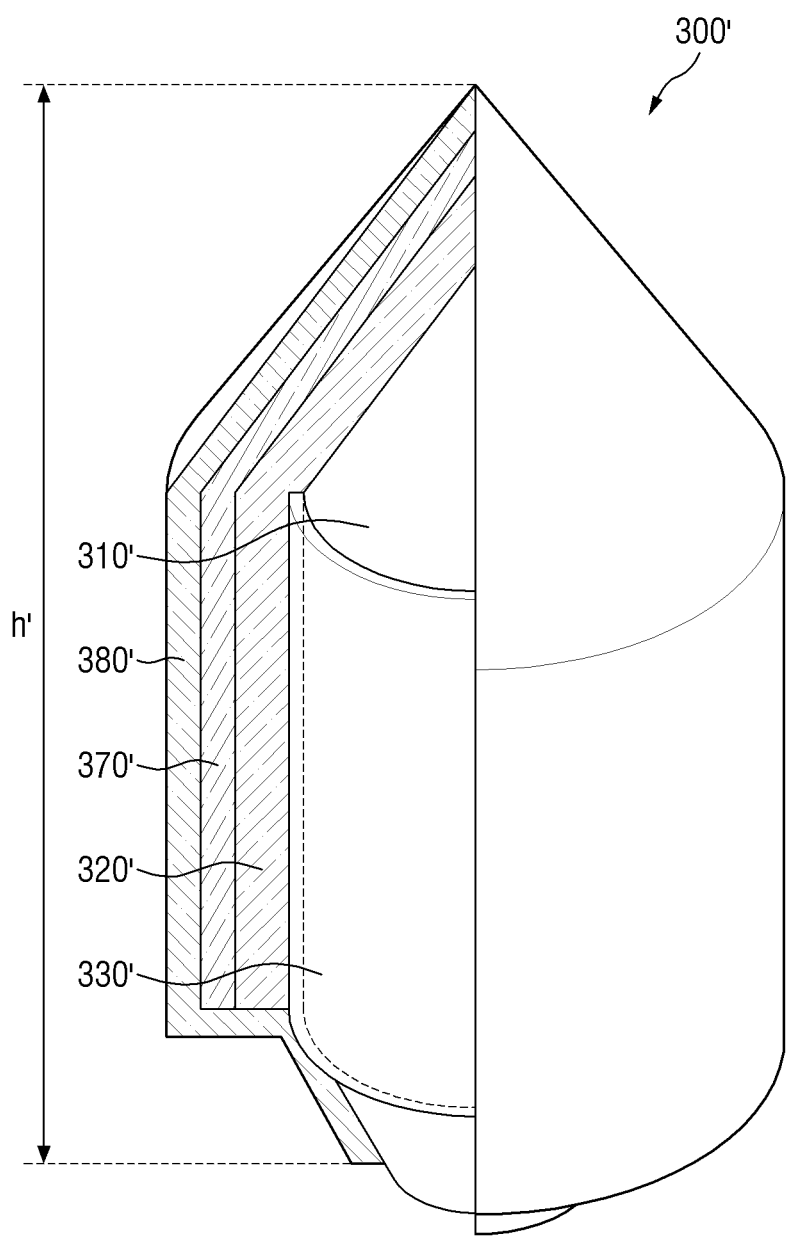
FIG. 24 is a schematic view of a light emitting element according to another embodiment.

FIG. 24 is a schematic view of a light emitting element according to an embodiment.

Referring to FIG. 24, a light emitting element 300' may be formed so that layers surround outer surfaces of different layers without being stacked in one direction. The light emitting element 300' of FIG. 24 is identical to the light emitting element 300 of FIG. 23 except that the shape of the layers is partially different. Hereinafter, only the differences will be described.

According to an embodiment, a first conductive semiconductor 310' may extend in one direction and have both end portions formed to be inclined toward a central portion. The first conductive semiconductor 310' of FIG. 24 may have a shape including a rod-like or cylindrical main body part and conical end portions formed at an upper portion and a lower portion of the main body part. The upper end portion of the main body part may have a steeper slope than the lower end portion thereof.

An active layer 330' is disposed to surround an outer surface of the main body part of the first conductive semiconductor 310'. The active layer 330' may have an annular shape extending in one direction. The active layer 330' is not formed on the upper end portion and the lower end portion of the first conductive semiconductor 310'. The active layer 330' may only contact the parallel side surfaces of the first conductive semiconductor 310'.

A second conductive semiconductor 320' is disposed to surround an outer surface of the active layer 330' and the upper end portion of the first conductive semiconductor 310'. The second conductive semiconductor 320' may include an annular main body part extending in one direction and an upper end portion having a side surface formed to be inclined. The second conductive semiconductor 320' may come in direct contact with parallel side surfaces of the active layer 330' and the inclined upper end portion of the first conductive semiconductor 310'. However, the second conductive semiconductor 320' is not formed on the lower end portion of the first conductive semiconductor 310'.

An electrode material layer 370' is disposed to surround an outer surface of the second conductive semiconductor 320'. The shape of the electrode material layer 370' may be substantially the same as the shape of the second conductive semiconductor 320'. The electrode material layer 370' may fully contact the outer surface of the second conductive semiconductor 320'.

An insulating film 380' may be disposed to surround outer surfaces of the electrode material layer 370' and the first conductive semiconductor 310'. The insulating film 380' may directly contact the lower end portion of the first conductive semiconductor 310' and the exposed lower end portions of the active layer 330' and the second conductive semiconductor 320' as well as the electrode material layer 370'.

A length h' of the light emitting element 300' may be in a range of about 1 μm to about 10 μm or in a range of about 2 μm to about 5 μm, and may be a length around about 4 μm. Also, a diameter of the light emitting element 300' may be in a range of about 300 nm to about 700 nm, and the light emitting elements 300' included in the display device 10 may have different diameters according to a difference in composition of the active layer 330. The diameter of the light emitting element 300 may be in a range of about 500 nm.

According to an embodiment, the inkjet printing device 1000 may disperse the light emitting elements 300 of FIG. 23 or the light emitting elements 300' of FIG. 24 in the ink 30 and eject or discharge the ink 30 onto the target substrate SUB, and in this way, the display device 10 including the light emitting elements 300 may be manufactured.

Figure 25:
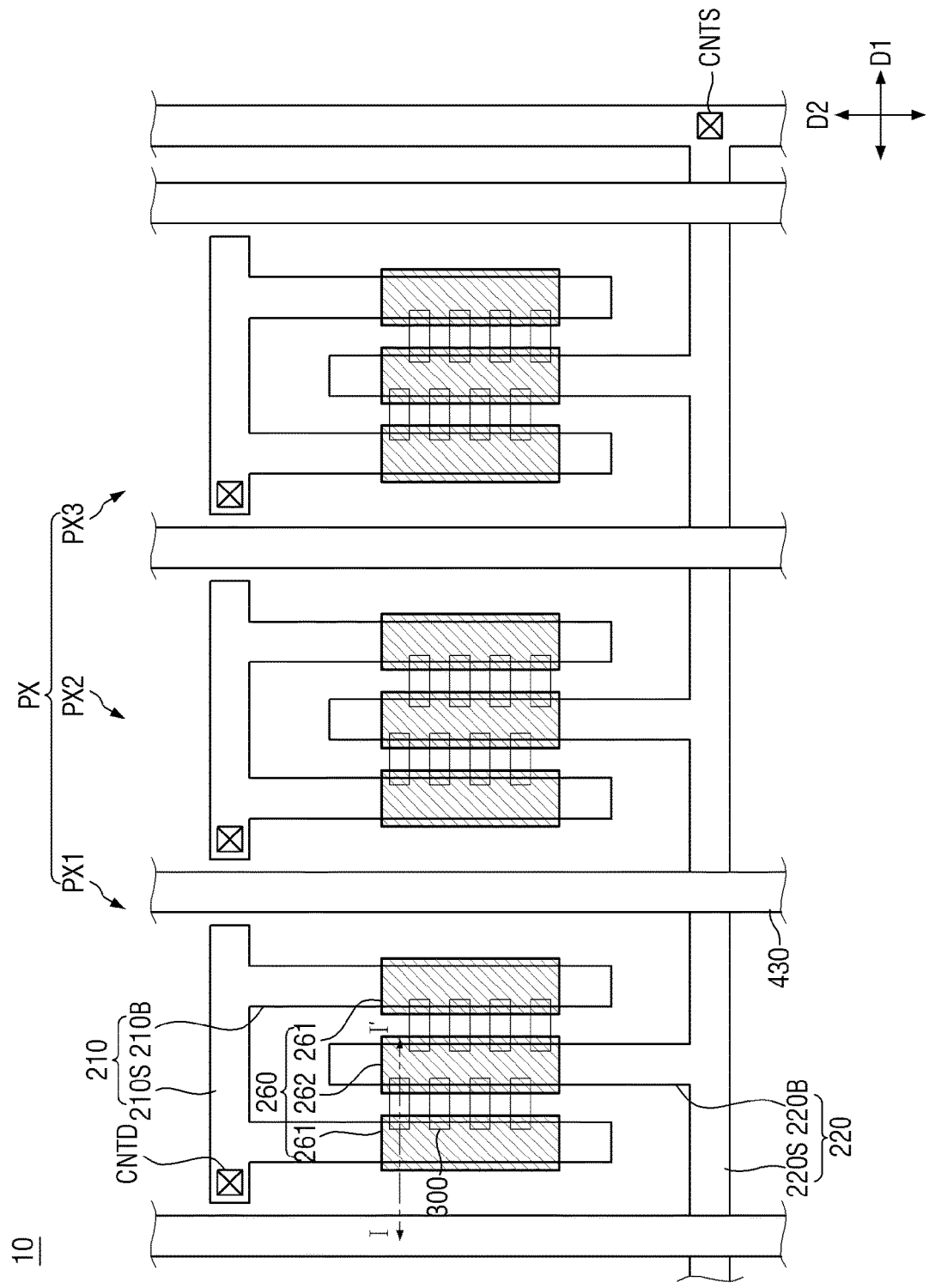
FIG. 25 is a schematic plan view of a display device manufactured using a method according to an embodiment.

FIG. 25 is a schematic plan view of a display device manufactured using a method according to an embodiment.

Referring to FIG. 25, the display device 10 may include pixels PX. The pixels PX may each include one or more light emitting elements 300, that emit light in a specific wavelength band, to display a specific color.

The pixels PX may each include a first subpixel PX1, a second subpixel PX2, and a third subpixel PX3. Hereinafter, the subpixels PX1, PX2, and PX3 may also be referred to as PXn. The first subpixel PX1 may emit light of a first color, the second subpixel PX2 may emit light of a second color, and the third subpixel PX3 may emit light of a third color. The first color may be red, the second color may be green, and the third color may be blue, but the embodiments are not limited thereto, and each subpixel PXn may also emit light of the same color. Also, although FIG. 25 illustrates a case in which each pixel PX includes three subpixels, the embodiments are not limited thereto, and each pixel PX may include more subpixels.

Each subpixel PXn of the display device 10 may include areas defined as a light emitting area and a non-light emitting area. The light emitting area may be defined as an area in which the light emitting elements 300 included in the display device 10 are disposed and from which light in a specific wavelength band is emitted. The non-light emitting area is an area other than the light emitting area and may be defined as an area in which the light emitting elements 300 are not disposed and from which light is not emitted.

The subpixels PXn of the display device 10 may include a third banks 430, electrodes 210 and 220, and the light emitting elements 300.

The electrodes 210 and 220 may be electrically connected to the light emitting elements 300 and may receive a voltage so that the light emitting elements 300 emit light. Also, in order to align the light emitting elements 300, at least a portion of each of the electrodes 210 and 220 may be utilized to form an electrical field in the subpixel PXn. However, the embodiments are not limited thereto, and the electric field may also be formed by a separate alignment signal application device.

In reference to FIG. 25, the of electrodes 210 and 220 may include a first electrode 210 and a second electrode 220. In an embodiment, the first electrode 210 may be a pixel electrode separated for each subpixel PXn, and the second electrode 220 may be a common electrode connected in common along each subpixel PXn. Any one of the first electrode 210 and the second electrode 220 may be an anode electrode of the light emitting element 300, and the other one thereof may be a cathode electrode of the light emitting element 300. However, the embodiments are not limited thereto, and it may also be the other way around.

The first electrode 210 and the second electrode 220 may respectively include electrode stem portions 210S and 220S disposed to extend in a first direction D1 and one or more electrode branch portions 210B and 220B that extend and branch from the electrode stem portions 210S and 220S in a second direction D2 that is perpendicular to the first direction D1.

The first electrode 210 may include a first electrode stem portion 210S disposed to extend in the first direction D1 and one or more electrode branch portions 210B that branch from the first electrode stem portion 210S and extend in the second direction D2.

The first electrode stem portion 210S of one pixel may have both ends that are spaced apart and terminate between the subpixels PXn and may be substantially collinear with the first electrode stem portion 210S of a neighboring subpixel that belongs to the same row (e.g., is adjacent in the first direction D1). Accordingly, the first electrode stem portions 210S disposed in each subpixel PXn may apply different electrical signals to each first electrode branch portion 210B, and the first electrode branch portions 210B may be driven separately.

The first electrode branch portion 210B may branch from at least a portion of the first electrode stem portion 210S, extend in the second direction D2, and terminate while being spaced apart from a second electrode stem portion 220S that is disposed opposite to the first electrode stem portion 210S.

The second electrode 220 may include the second electrode stem portion 220S that is disposed to extend in the first direction D1 and may be spaced apart from and opposite to the first electrode stem portion 210S, and a second electrode branch portion 220B that is disposed to branch from the second electrode stem portion 220S and extend in the second direction D2. However, the other end portion of the second electrode stem portion 220S may extend to the subpixels PXn that are adjacent thereto in the first direction D1. Accordingly, the second electrode stem portion 220S of one pixel may have both ends that are connected to the second electrode stem portion 220S of a neighboring pixel between the pixels PX.

The second electrode branch portion 220B may be spaced apart from and opposite to the first electrode branch portion 210B and may terminate while being spaced apart from the first electrode stem portion 210S. The second electrode branch portion 220B may be disposed in the subpixel PXn while one end portion is connected to the second electrode stem portion 220S and the other end portion is spaced apart from the first electrode stem portion 210S.

Although FIG. 25 illustrates two first electrode branch portions 210B and the second electrode branch portion 220B disposed between the first electrode branch portions 210B, the embodiments are not limited thereto.

The pixel PX may include banks, for example, a third bank 430 disposed at a boundary between the subpixels PXn and a first bank 410 and a second bank 420 (refer to FIG. 26) that are respectively disposed at lower portions of the electrodes 210 and 220. Although the first bank 410 and the second bank 420 are not illustrated in the drawing, the first bank 410 and the second bank 420 may be disposed at lower portions of the first electrode branch portion 210B and the second electrode branch portion 220B, respectively.

The third bank 430 may be disposed at the boundary between the subpixels PXn. The first electrode stem portions 210S may have end portions that are spaced apart from each other and terminate based on the third bank 430. The third bank 430 may extend in the second direction D2 and may be disposed at the boundary between the subpixels PXn arranged in the first direction D1. However, the embodiments are not limited thereto, and the third bank 430 may also extend in the first direction D1 and may be disposed at the boundary between the subpixels PXn arranged in the second direction D2. The subpixels PXn may be differentiated based on the third bank 430. The third bank 430 may include the same material as the first bank 410 and the second bank 420 and may be formed through substantially the same process as the first bank 410 and the second bank 420.

Although not illustrated in FIG. 25, a first insulating layer 510 that covers the entire area of the subpixel PXn as well as the first electrode branch portion 210B and the second electrode branch portion 220B may be disposed in each subpixel PXn. The first insulating layer 510 may simultaneously protect the electrodes 210 and 220 and insulate the electrodes 210 and 220 from each other so that the electrodes 210 and 220 do not come in direct contact.

The light emitting elements 300 may be aligned between the first electrode branch portion 210B and the second electrode branch portion 220B. At least some of the light emitting elements 300 may have one end portion electrically connected to the first electrode branch portion 210B and the other end portion electrically connected to the second electrode branch portion 220B.

The light emitting elements 300 may be spaced apart in the second direction D2 and aligned so as to be substantially parallel to each other. Intervals at which the light emitting elements 300 are spaced apart are not limited. In some cases, a light emitting elements 300 may be disposed adjacent to each other to form a group, and the other light emitting elements 300 may form a group in a state of being spaced apart therefrom at an interval, have a non-uniform density, and may be oriented and aligned in one direction.

A contact electrode 260 may be disposed on each of the first electrode branch portion 210B and the second electrode branch portion 220B. However, the contact electrode 260 may be disposed substantially on the first insulating layer 510 (not illustrated), and at least some of the contact electrodes 260 may contact or may be electrically connected to the first electrode branch portion 210B and the second electrode branch portion 220B.

The contact electrodes 260 may be disposed to extend in the second direction D2 and disposed to be spaced apart from each other in the first direction D1. The contact electrode 260 may contact at least one end portion of the light emitting element 300, and the contact electrode 260 may contact the first electrode 210 or the second electrode 220 to receive an electrical signal. Accordingly, the contact electrode 260 may transmit an electrical signal, which is transmitted from each of the electrodes 210 and 220, to the light emitting element 300.

The contact electrodes 260 may include a first contact electrode 261 and a second contact electrode 262. The first contact electrode 261 may be disposed on the first electrode branch portion 210B and may contact one end portion of the light emitting element 300, and the second contact electrode 262 may be disposed on the second electrode branch portion 220B and may contact the other end portion of the light emitting element 300.

The first electrode stem portion 210S and the second electrode stem portion 220S may be electrically connected to a circuit element layer of the display device 10 through contact holes, e.g., a first electrode contact hole CNTD, and a second electrode contact hole CNTS, respectively. A case in which a single second electrode contact hole CNTS is formed in the second electrode stem portion 220S of the subpixels PXn is illustrated in the drawing. However, the embodiments are not limited thereto, and in some cases, the second electrode contact hole CNTS may be formed in each subpixel PXn.

Also, although not illustrated in FIG. 25, the display device 10 may include a second insulating layer 520 (refer to FIG. 26) and a passivation layer 550 (refer to FIG. 26) that are disposed to cover each of the electrodes 210 and 220 and at least some of the light emitting elements 300. The arrangement, structure, etc. thereof will be described below with reference to FIG. 26.

Figure 26:
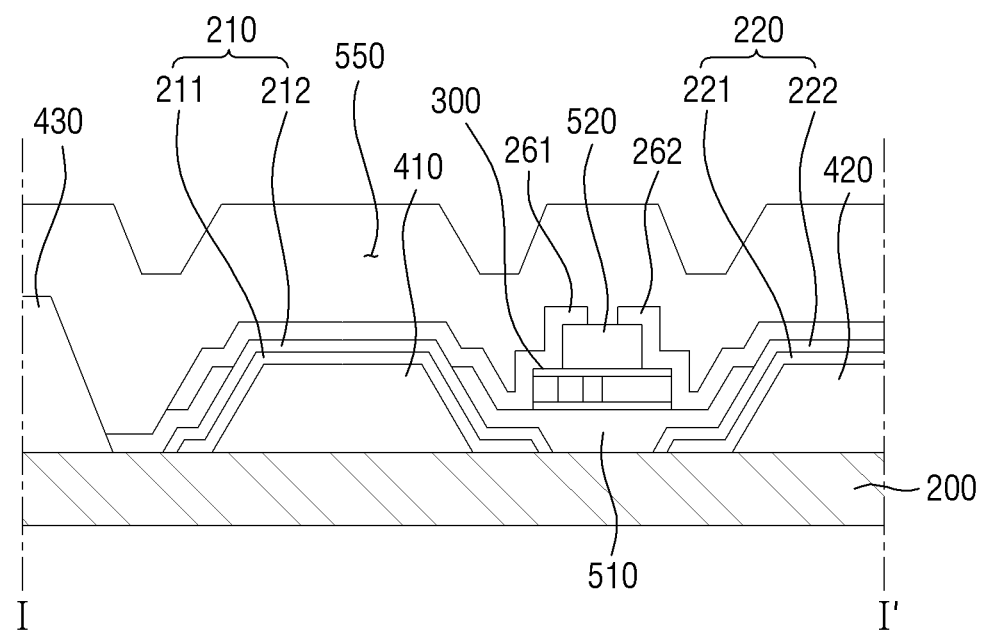
FIG. 26 is a schematic partial cross-sectional view of the display device taken along line I-I' of FIG. 25.

FIG. 26 is a partial schematic cross-sectional view of the display device taken along line I-I' of FIG. 25.

FIG. 26 only illustrates a cross-sectional view of the first subpixel PX1, but the cross-sectional view may apply to other pixels PX or subpixels PXn. FIG. 26 illustrates a cross-section that cuts across one end portion and the other end portion of a light emitting element 300.

Although not illustrated in FIG. 26, the display device 10 may further include the circuit element layer disposed at the lower portion of each of the electrodes 210 and 220. The circuit element layer includes semiconductor layers and conductive patterns and may include at least one transistor and a power line. However, hereinafter, detailed description thereof will be omitted.

Referring to FIG. 26, the display device 10 may include a via layer 200, the electrodes 210 and 220 and the light emitting element 300 disposed on the via layer 200, and the like. A circuit element layer (not illustrated) may be further disposed at a lower portion of the via layer 200. The via layer 200 may include an organic insulating material and perform a surface planarization function.

The banks 410, 420, and 430 are disposed on the via layer 200. The banks 410, 420, and 430 may be disposed to be spaced apart from each other in each subpixel PXn. The banks 410, 420, and 430 may include the first bank 410 and the second bank 420 that are disposed to be adjacent to a central portion of the subpixel PXn and the third bank 430 disposed at the boundary between the subpixels PXn.

In case that the ink 30 is ejected using the above-described inkjet printing device 1000 of FIG. 1 during manufacture of the display device 10, the third bank 430 may serve to prevent the ink 30 from flowing over the boundary between the subpixels PXn. In case that the display device 10 further includes another component, the component may be disposed on the third bank 430, and the third bank 430 may serve to support the component. However, the embodiments are not limited thereto.

The first bank 410 and the second bank 420 are disposed to be spaced apart from and opposite to each other. The first electrode 210 may be disposed on the first bank 410, and the second electrode 220 may be disposed on the second bank 420. In FIGS. 25 and 26, the first electrode branch portion 210B may be disposed on the first bank 410 and the second bank electrode branch portion 220B is disposed on the second bank 420.

As described above, the first bank 410, the second bank 420, and the third bank 430 may be formed through substantially the same process. Accordingly, the banks 410, 420, and 430 may also form a single grid pattern. The banks 410, 420, and 430 may include polyimide (PI).

In the banks 410, 420, and 430 at least a portion may protrude from the via layer 200. The banks 410, 420, and 430 may protrude upward based on a plane on which the light emitting elements 300 are disposed, and at least a portion of the protruding portion may have a slope. The shape of the banks 410, 420, and 430 having the protruding structure is not limited. As illustrated in the drawing, the first bank 410 and the second bank 420 may protrude to the same height while the third bank 430 protrudes to a higher position.

Reflective layers 211 and 221 may be disposed on the first bank 410 and the second bank 420, and electrode layers 212 and 222 may be disposed on the reflective layers 211 and 221. The reflective layers 211 and 221 and the electrode layers 212 and 222 may constitute the electrodes 210 and 220.

The reflective layers 211 and 221 include a first reflective layer 211 and a second reflective layer 221. The first reflective layer 211 may cover the first bank 410, and the second reflective layer 221 may cover the second bank 420. Portions of the reflective layers 211 and 221 are electrically connected to the circuit element layer through a contact hole that passes through the via layer 200.

The reflective layers 211 and 221 may include a highly reflective material and reflect light emitted from the light emitting element 300. For example, the reflective layers 211 may include materials such as silver (Ag), copper (Cu), indium tin oxide (ITO), indium zinc oxide (IZO), and indium tin-zinc oxide (ITZO), but the embodiments are not limited thereto.

The electrode layers 212 and 222 include a first electrode layer 212 and a second electrode layer 222. The electrode layers 212 and 222 may have substantially the same pattern as the reflective layers 211 and 221. The first reflective layer 211 and the first electrode layer 212 may be disposed to be spaced apart from the second reflective layer 221 and the second electrode layer 222.

The electrode layers 212 and 222 may include a transparent conductive material, and light that is emitted from the light emitting element 300 may be incident on the reflective layers 211 and 221. For example, the electrode layers 212 and 222 may include materials such as indium tin oxide (ITO), indium zinc oxide (IZO), and indium tin-zinc oxide (ITZO), but the embodiments are not limited thereto.

In some embodiments, the reflective layers 211 and 221 and the electrode layers 212 and 222 may form a structure in which one or more transparent conductive layers made of ITO, IZO, ITZO, or the like and one or more metal layers made of copper or the like are stacked. For example, the reflective layers 211 and 221 and the electrode layers 212 and 222 may also form a stacked structure of ITO/Ag/ITO/IZO.

In some embodiments, the first electrode 210 and the second electrode 220 may be formed as a single layer. The reflective layers 211 and 221 and the electrode layers 212 and 222 may be formed as a single layer, and the layer may simultaneously transmit an electrical signal to the light emitting element 300 and reflect light. In an embodiment, the first electrode 210 and the second electrode 220 may include a highly-reflective, conductive material. For example, the first electrode 210 and the second electrode 220 may be made of an alloy containing aluminum (Al), nickel (Ni), lanthanum (La), and the like. However, the embodiments are not limited thereto.

The first insulating layer 510 (not illustrated) may partially cover the first electrode 210 and the second electrode 220. The first insulating layer 510 may cover most of the upper surface of each of the first electrode 210 and the second electrode 220 and may allow portions of the first electrode 210 and the second electrode 220 to be exposed. The first insulating layer 510 may be disposed to also partially cover an area in which the first electrode 210 and the second electrode 220 are spaced apart and the sides of the first electrode 210 and the second electrode 220 that are opposite to the area.

The first insulating layer 510 (not illustrated) may be disposed so that a relatively planar upper surface of each of the first electrode 210 and the second electrode 220 is exposed and may be disposed so that the electrodes 210 and 220 overlap inclined side surfaces of the first bank 410 and the second bank 420. The first insulating layer 510 may form a planar upper surface so that the light emitting element 300 is disposed thereon, and the upper surface extends in one direction toward the first electrode 210 and the second electrode 220. The extending portion of the first insulating layer 510 may terminate at the inclined side surfaces of the first electrode 210 and the second electrode 220. Accordingly, the contact electrode 260 may contact the exposed portions of the first electrode 210 and the second electrode 220 and may smoothly contact the light emitting element 300 on the planar upper surface of the first insulating layer 510.

The first insulating layer 510 (not illustrated) may simultaneously protect the first electrode 210 and the second electrode 220 and insulate the first electrode 210 and the second electrode 220 from each other. Also, the first insulating layer 510 may prevent the light emitting element 300, which is disposed on the first insulating layer 510, from directly contacting other components and causing damage thereto.

The light emitting element 300 may be disposed on the first insulating layer 510 (not illustrated). One or more light emitting elements 300 may be disposed on the first insulating layer 510 between the first electrode 210 and the second electrode 220. In the light emitting element 300, layers may be disposed in a direction horizontal to the via layer 200. In the light emitting element 300 of the display device 10 according to an embodiment, the first conductive semiconductor 310, the active layer 330, the second conductive semiconductor 320, and the electrode material layer 370 may be sequentially disposed in the direction horizontal to the via layer 200. However, the embodiments are not limited thereto. The order in which layers of the light emitting element 300 are disposed may be reversed, and in some cases, in case that the light emitting element 300 has a different structure, the layers may be disposed in a direction perpendicular to the via layer 200.

The second insulating layer 520 may be partially disposed on the light emitting element 300. The second insulating layer 520 may simultaneously protect the light emitting element 300 and fix the light emitting element 300 in the process of manufacturing the display device 10. The second insulating layer 520 may be disposed to surround the outer surface of the light emitting element 300. A portion of the material of the second insulating layer 520 may be disposed between the lower surface of the light emitting element 300 and the first insulating layer 510 (not illustrated). In a plan view, the second insulating layer 520 may extend in the second direction D2 between the first electrode branch portion 210B and the second electrode branch portion 220B and have an island-like or linear shape.

The contact electrodes 260 are disposed on each of the electrodes 210 and 220 and the second insulating layer 520. The contact electrodes 260 include the first contact electrode 261 disposed on the first electrode 210 and the second contact electrode 262 disposed on the second electrode 220. The first contact electrode 261 and the second contact electrode 262 are disposed to be spaced apart from each other on the second insulating layer 520. Accordingly, the second insulating layer 520 may insulate the first contact electrode 261 and the second contact electrode 262 from each other.

The first contact electrode 261 may contact at least the first electrode 210 and one end portion of the light emitting element 300 that are exposed due to the first insulating layer 510 (not illustrated) being patterned. The second contact electrode 262 may contact at least the second electrode 220 and the other end portion of the light emitting element 300 that are exposed due to the first insulating layer 510 being patterned. The first and second contact electrodes 261 and 262 may contact side surfaces of both end portions of the light emitting element 300, e.g., the first conductive semiconductor 310, the second conductive semiconductor 320, or the electrode material layer 370. As described above, the first insulating layer 510 may form a planar upper surface so that the contact electrodes 260 smoothly contact the side surfaces of the light emitting element 300.

The contact electrode 260 may include a conductive material. For example, the contact electrode 260 may include ITO, IZO, ITZO, Al, and the like. However, the embodiments are not limited thereto.

The passivation layer 550 may be formed at an upper portion of the second insulating layer 520 and the contact electrode 260 and serve to protect the components disposed on the via layer 200 from an external environment.

Each of the first insulating layer 510 (not illustrated), the second insulating layer 520, and the passivation layer 550, which have been described above, may include an inorganic insulating material or an organic insulating material. In an embodiment, the first insulating layer 510 and the passivation layer 550 may include materials such as silicon oxide ($SiO_x$), silicon nitride ($SiN_x$), silicon oxynitride ($SiO_xN_y$), aluminum oxide ($Al_2O_3$), aluminum nitride (AlN), and the like. The second insulating layer 520 may include a photoresist or the like as an organic insulating material. However, the embodiments are not limited thereto.

In concluding the detailed description, those skilled in the art will appreciate that many variations and modifications can be made to the embodiments without substantially departing from the principles of the disclosure. Therefore, the disclosed embodiments of the disclosure are used in a generic and descriptive sense only and not for purposes of limitation.

What is claimed is:

1. An inkjet printing device comprising:
   an ink reservoir that stores an ink that contains particles, including a first outlet formed on a first surface of the ink reservoir in the gravity direction and a second outlet formed on a second surface which is opposite surface to the first surface in the gravity direction;
   an inkjet head part that receives the ink from the ink reservoir and ejects the ink onto a target substrate;
   a driver that rotates the ink reservoir; and
   a first pipe connected between the first outlet and the inkjet head unit, and a second pipe connected between the second outlet and the inkjet head unit, wherein
   one of the first outlet and the second outlet blocks the movement of the ink toward the inkjet head unit when the ink flows through the other outlet of the first outlet and the second outlet.

2. The inkjet printing device of claim 1, wherein
   the driver rotates the ink reservoir with respect to a rotation axis, and
   the rotation axis is a driving shaft of the driver on a reference plane that is perpendicular or tilted with respect to a direction of gravity acting on the ink of the ink reservoir.

3. The inkjet printing device of claim 2, wherein:
   the ink reservoir includes a first surface and a second surface opposite to the first surface, and
   the reference plane is disposed at an equal distance from the first surface and the second surface.

4. The inkjet printing device of claim 1, further comprising:
   a valve connected to the first pipe and the second pipe; and
   a third pipe connected to the valve and the inkjet head part,
   wherein the valve blocks the connection to at least one of the first pipe, the second pipe, and the third pipe.

5. The inkjet printing device of claim 1, further comprising a sensor that measures a degree of dispersion of the particles in the ink stored in the ink reservoir.

6. The inkjet printing device of claim 5, wherein
   a sensing area is defined in the direction of gravity acting on the ink in the ink reservoir, and
   the sensor measures the degree of dispersion of the particles in the sensing area.

7. The inkjet printing device of claim 5, wherein the inkjet head part includes:
   a head base part; and
   an inkjet head that includes nozzles that eject the ink containing the particles.

8. A particle ejecting method comprising:
   preparing an ink having particles in an ink reservoir;
   measuring a first degree of dispersion of the particles in the ink reservoir;
   ejecting the ink onto a target substrate;
   measuring a second degree of dispersion of the particles precipitated in the ink reservoir; and
   rotating the ink reservoir in case that a ratio of the first degree of dispersion and the second degree of dispersion exceeds a reference value, wherein
   the ink reservoir includes a first outlet formed on a first surface of the ink reservoir in the gravity direction and a second outlet formed on a second surface which is opposite surface to the first surface in the gravity direction,
   the ejecting the ink onto a target is performed by an inkjet head unit configured to receive the ink from the ink reservoir and eject the ink onto a target substrate,
   the inkjet head unit is connected to the first outlet through a first pipe and connected to the second outlet through a second pipe, and
   one of the first outlet and the second outlet blocks the movement of the ink toward the inkjet head unit when the ink flows through the other outlet of the first outlet and the second outlet.

9. The particle ejecting method of claim 8, wherein the rotating of the ink reservoir includes rotating the ink reservoir with respect to a rotation axis which is a driving shaft on a reference plane that is perpendicular or tilted with respect to a direction of gravity acting on the ink of the ink reservoir.

10. The particle ejecting method of claim 9, wherein the particles include a light emitting element having a dipole.

11. The particle ejecting method of claim 10, further comprising:
preparing an electric field on the target substrate after the ink is ejected onto the target substrate; and
aligning the particles on the target substrate in a direction in which the particles are oriented by the electric field.

12. The particle ejecting method of claim 8, wherein the ink is ejected through the first outlet when the particles have the first degree of dispersion and is ejected through the second outlet after the ink reservoir is rotated.

13. A method for manufacturing a display device, the method comprising:
preparing a target substrate including a first electrode and a second electrode;
preparing an ink containing light emitting elements in an ink reservoir;
ejecting the ink onto the target substrate;
measuring a degree of dispersion of the light emitting elements precipitated in the ink reservoir; and
rotating the ink reservoir in case that the degree of dispersion of the light emitting elements exceeds a reference value, wherein
the ink reservoir includes a first outlet formed on a first surface of the ink reservoir in the gravity direction and a second outlet formed on a second surface which is opposite surface to the first surface in the gravity direction, the ejecting the ink onto a target is performed by an inkjet head unit configured to receive the ink from the ink reservoir and eject the ink onto a target substrate,
the inkjet head unit is connected to the first outlet through a first pipe and connected to the second outlet through a second pipe, and
one of the first outlet and the second outlet blocks the movement of the ink toward the inkjet head unit when the ink flows through the other outlet of the first outlet and the second outlet.

14. The method of claim 13, wherein
the rotating of the ink reservoir includes rotating the ink reservoir with respect to a rotation axis which is a driving shaft on a reference plane that is perpendicular or tilted with respect to a direction of gravity acting on the ink, and
the light emitting elements precipitated in the ink reservoir are dispersed in the ink.

15. The method of claim 14, further comprising:
stopping the ejecting of the ink in case that the degree of dispersion of the light emitting elements exceeds the reference value.

16. The method of claim 15, further comprising:
forming an electric field on the target substrate after the ink is ejected; and
aligning the light emitting elements on the target substrate in a direction in which the light emitting elements are oriented by the electric field so that the light emitting elements land between the first electrode and the second electrode.

* * * * *